US011973465B2

(12) United States Patent
You

(10) Patent No.: US 11,973,465 B2
(45) Date of Patent: Apr. 30, 2024

(54) OSCILLATOR CIRCUIT

(71) Applicant: Huawei Technologies Co., Ltd., Shenzhen (CN)

(72) Inventor: Huancheng You, Shanghai (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 18/065,681

(22) Filed: Dec. 14, 2022

(65) Prior Publication Data

US 2023/0109745 A1 Apr. 13, 2023

Related U.S. Application Data

(63) Continuation of application No. PCT/CN2020/097263, filed on Jun. 19, 2020.

(51) Int. Cl.

*H03B 5/12* (2006.01)
*H03L 7/08* (2006.01)
*H03L 7/099* (2006.01)

(52) U.S. Cl.

CPC ......... *H03B 5/1206* (2013.01); *H03B 5/1212* (2013.01); *H03B 5/1228* (2013.01); *H03B 5/1268* (2013.01); *H03L 7/0802* (2013.01); *H03L 7/099* (2013.01)

(58) Field of Classification Search

CPC .. H03B 5/1206; H03B 5/1212; H03B 5/1228; H03B 5/1268; H03L 7/0802; H03L 7/099
USPC .............................. 331/2, 167, 179, 107 SL
See application file for complete search history.

(56) References Cited

U.S. PATENT DOCUMENTS 7,154,349 B2 * 12/2006 Cabanillas .......... H03B 5/1265 331/177 V

* cited by examiner

*Primary Examiner* — Arnold M Kinkead
(74) *Attorney, Agent, or Firm* — Slater Matsil, LLP

(57) ABSTRACT

An oscillator circuit is provided. The oscillator circuit includes a first oscillator, a second oscillator, and a switch matrix. The first oscillator includes a first transconductance amplifier, a second transconductance amplifier, and a first resonator. The second oscillator includes a third transconductance amplifier, a fourth transconductance amplifier, and a second resonator. The first resonator includes a first capacitor element and a first inductor element. The second resonator includes a second capacitor element and a second inductor element. The first inductor element is coupled to the second inductor element. The switch matrix includes a first switch, a second switch, a third switch, and a fourth switch.

20 Claims, 23 Drawing Sheets

OSCILLATOR CIRCUIT

CROSS-REFERENCE TO RELATED APPLICATIONS

This application is a continuation of International Application No. PCT/CN2020/097263, filed on Jun. 19, 2020, the disclosure of which is hereby incorporated by reference in its entirety.

TECHNICAL FIELD

This application relates to the field of chip technologies, and in particular, to an oscillator circuit.

BACKGROUND

With development and evolution of wireless communication, communication protocols and frequency bands supported by terminal devices constantly increase. Consequently, a frequency range covered by an oscillator in a phase locked loop (PLL) in a radio frequency chip (RFIC) constantly expands.

When the frequency coverage area of the oscillator expands, power consumption of the oscillator increases, and noise during outputting by the PLL also increases. Therefore, to achieve noise performance required by the PLL at acceptable power consumption, one PLL usually needs to integrate a plurality of oscillators, to meet requirements on frequency coverage, noise, and power consumption. In addition, to support a plurality of communication modes, one RFIC integrates a plurality of PLLs. As a result, oscillators occupy a considerable area of the radio frequency chip, affecting chip costs.

SUMMARY

Embodiments of this application provide an oscillator circuit, to reduce a quantity of oscillators in a PLL and reduce an area of a radio frequency chip, thereby reducing chip costs.

To achieve the foregoing objective, the following technical solutions are used in embodiments of this application.

According to a first aspect, an oscillator circuit is provided. The oscillator circuit includes a first oscillator, a second oscillator, and a switch matrix. The first oscillator includes a first transconductance amplifier, a second transconductance amplifier, and a first resonator. The second oscillator includes a third transconductance amplifier, a fourth transconductance amplifier, and a second resonator. The first resonator includes a first capacitor element and a first inductor element, the second resonator includes a second capacitor element and a second inductor element, and the first inductor element is coupled to the second inductor element. The switch matrix includes a first switch, a second switch, a third switch, and a fourth switch. The first switch is coupled to an output port of the first transconductance amplifier and an output port of the third transconductance amplifier. The second switch is coupled to the output port of the first transconductance amplifier and an output port of the fourth transconductance amplifier. The third switch is coupled to an output port of the second transconductance amplifier and the output port of the third transconductance amplifier. The fourth switch is coupled to the output port of the second transconductance amplifier and the output port of the fourth transconductance amplifier. The switch matrix is configured to change a coupling coefficient between the first inductor element and the second inductor element.

Therefore, in the oscillator circuit provided in this application, the switch matrix is coupled to the two oscillators. Some switch combinations in the switch matrix may be controlled to be turned on and some switch combinations in the switch matrix may be controlled to be turned off. In this way, when different switch combinations are turned on, the coupling coefficient between the first inductor element and the second inductor element changes, so that the oscillator circuit can operate at different frequencies. Therefore, in this application, frequency conversion of the oscillator circuit can be implemented by coupling the switch matrix to the oscillator circuit with the two oscillators in a PLL. In comparison with a PLL system that integrates at least two oscillators, the oscillator circuit in this application can reduce a chip area and reduce a loss of a component. In addition, in the oscillator circuit in this application, a mode switching module of the operating frequency can be further independent of an oscillation loop in a manner of coupling the switch matrix to the two oscillators. This helps maintain a high quality factor of the oscillation loop.

In a possible design, the switch matrix changes the coupling coefficient by controlling relative current directions of the first inductor element and the second inductor element. The switch matrix is configured to: when the relative current directions of the first inductor element and the second inductor element are the same, control the coupling coefficient between the first inductor element and the second inductor element to be greater than zero, and the oscillator circuit to operate at a first frequency. The switch matrix is configured to: when the relative current directions of the first inductor element and the second inductor element are opposite, control the coupling coefficient between the first inductor element and the second inductor element to be less than zero, and the oscillator circuit to operate at a second frequency, where the second frequency is higher than the first frequency.

When the oscillator circuit operates at the first frequency, it may be considered that the oscillator circuit operates in a low-frequency mode. When the oscillator circuit operates at the second frequency, it may be considered that the oscillator circuit operates in a high-frequency mode. It is assumed herein that an inductance of the first inductor element is L1, an inductance of the second inductor element is L4, a capacitance of the first capacitor element is C1, a capacitance of the second capacitor element is C2, and a coupling coefficient is K. In this case, an operating frequency $F_{osc}$ of the oscillator circuit may be represented $$F_{osc} = \frac{1}{2\pi\sqrt{\left(L1 + K\sqrt{L1L4}\right)C1}} = \frac{1}{2\pi\sqrt{\left(L4 + K\sqrt{L1L4}\right)C2}}.$$

It can be learned that $F_{osc}$ obtained when the coupling coefficient is less than 0 is greater than $F_{osc}$ obtained when the coupling coefficient is greater than 0. In other words, when the coupling coefficient is less than 0, the oscillator circuit operates in the high-frequency mode, and when the coupling coefficient is greater than 0, the oscillator circuit operates in the low-frequency mode.

In a possible design, control signals of the first switch and the fourth switch are the same, and control signals of the second switch and the third switch are the same.

In this way, when a group of switches with same control signals can be turned on, another group of switches with same control signals can be turned off. When different switch combinations are turned on, manners of injecting currents into the first oscillator and the second oscillator are different, so that the relative current directions of the inductor elements of the first oscillator and the second oscillator can be changed.

In a possible design, when the first switch and the fourth switch are turned on, the second switch and the third switch are turned off, or when the first switch and the fourth switch are turned off, the second switch and the third switch are turned on.

In a possible design, when the first switch and the fourth switch are turned on, and the second switch and the third switch are turned off, a phase of the output port of the first transconductance amplifier is the same as a phase of the output port of the third transconductance amplifier, a phase of the output port of the second transconductance amplifier is the same as a phase of the output port of the fourth transconductance amplifier, and the relative current directions of the first inductor element and the second inductor element are the same; or when the first switch and the fourth switch are turned off, and the second switch and the third switch are turned on, a phase of the output port of the first transconductance amplifier is the same as a phase of the output port of the fourth transconductance amplifier, a phase of the output port of the second transconductance amplifier is the same as a phase of the output port of the third transconductance amplifier, and the relative current directions of the first inductor element and the second inductor element are opposite.

In other words, in this application, when different switch combinations are controlled to be turned on or off, the relative current directions of the two inductor elements coupled to each other can be changed, thereby changing the coupling coefficient between the inductor elements, and changing the operating frequency of the oscillator circuit.

In a possible design, both the first oscillator and the second oscillator are of differential signal structures. The first oscillator includes a first differential input port and a first differential output port, the first differential input port includes a first input port and a second input port, and the first differential output port includes a first output port and a second output port. The first input port is coupled to an input port of the first transconductance amplifier, the second input port is coupled to an input port of the second transconductance amplifier, the first output port is coupled to the output port of the first transconductance amplifier, and the second output port is coupled to the output port of the second transconductance amplifier. The second oscillator includes a second differential input port and a second differential output port, the second differential input port includes a third input port and a fourth input port, and the second differential output port includes a third output port and a fourth output port. The third input port is coupled to an input port of the third transconductance amplifier, the fourth input port is coupled to an input port of the fourth transconductance amplifier, the third output port is coupled to the output port of the third transconductance amplifier, and the fourth output port is coupled to the output port of the fourth transconductance amplifier.

In a possible design, the first inductor element includes the first input port, the second input port, the first output port, and the second output port.

In other words, both the first inductor element and the second inductor element in this application are multi-port inductor elements. In addition, when the switch matrix is coupled between the first inductor element and the second inductor element in this application, if the first switch may be coupled between the output port of the first transconductance amplifier and the output port of the third transconductance amplifier, the first switch may be coupled between a terminal (a ninth terminal) to which the output port of the first transconductance amplifier is extended and a terminal (a tenth terminal) to which the output port of the third transconductance amplifier is extended, the second switch may be coupled between the terminal (the ninth terminal) to which the output port of the first transconductance amplifier is extended and a terminal (an eleventh terminal) to which the output port of the fourth transconductance amplifier is extended, the third switch may be coupled between a terminal (a twelfth terminal) to which the output port of the second transconductance amplifier is extended and the terminal (the tenth terminal) to which the output port of the third transconductance amplifier is extended, and the fourth switch may be coupled between the terminal (the twelfth terminal) to which the output port of the second transconductance amplifier is extended and the terminal (the eleventh terminal) to which the output port of the fourth transconductance amplifier is extended.

In a possible design, the first capacitor element is coupled between the first input port and the second input port, and the second capacitor element is coupled between the third input port and the fourth input port. It may be understood that the first capacitor element is connected in parallel to the first inductor element, and the second capacitor element is connected in parallel to the second inductor element.

In a possible design, the oscillator circuit further includes a third capacitor element and a fourth capacitor element, the third capacitor element is coupled between the first output port and the fourth output port, and the fourth capacitor element is coupled between the second output port and the third output port.

Phases of two terminals of each of the third capacitor element and the fourth capacitor element are also related to turning-on and turning-off of the switch combination of the switch matrix, so that the third capacitor element and the fourth capacitor element can be connected to the oscillator circuit and disconnected from the oscillator circuit under control of turning-on and turning-off of different switch combinations. In this way, a wider frequency range can be obtained when the operating frequency of the oscillator circuit is calculated.

For example, it is assumed herein that an inductance of the first inductor element is L1, an inductance of the second inductor element is L4, a capacitance of the first capacitor element is C1, a capacitance of the second capacitor element is C2, a capacitance of the third capacitor element is C3, a capacitance of the fourth capacitor element is C4, and the coupling coefficient is K. When the third capacitor element and the fourth capacitor element are also connected to the oscillator circuit, an operating frequency $F_{osc}''$ of the oscillator circuit may be represented as:

$$F_{osc''} = \frac{1}{2\pi\sqrt{\left(L1 + K\sqrt{L1L4}\right)\left(C1 + \frac{C3}{2} + \frac{C4}{2}\right)}} = \frac{1}{2\pi\sqrt{\left(L4 + K\sqrt{L1L4}\right)\left(C2 + \frac{C3}{2} + \frac{C4}{2}\right)}}.$$

It may be understood that, when the third capacitor element and the fourth capacitor element are connected to the oscillator circuit, the oscillator circuit can operate at an operating frequency lower than $F_{osc}$. This can further expand an operating frequency range of the oscillator circuit.

In a possible design, a main coil of each of the first inductor element and the second inductor element includes a plurality of metal layers. For example, the plurality of metal layers may include a low metal layer, a high metal layer, a top metal layer, and the like.

In a possible design, the first inductor element and the second inductor element overlap each other. The switch matrix may be disposed at an overlapping part. When turning-on and turning-off of the switch in the switch matrix are changed, coupling polarity between the first inductor element and the second inductor element can be changed, thereby changing the relative current directions of the first inductor element and the second inductor element. Changing of the relative current directions can enable the coupling coefficient to be greater than 0 or less than 0. When a layout of the chip is designed, an area of the overlapping part may be flexibly processed based on a design requirement. When the coupling coefficient is greater than 0 or less than 0, different areas designed may correspond to different absolute values of the coupling coefficient, to obtain a plurality of operating frequencies of the oscillator circuit. For example, when the area of the overlapping part is large, an absolute value of the coupling coefficient is large, and the operating frequency of the oscillator circuit is high, or when the area of the overlapping part is small, the absolute value of the coupling coefficient is small, and the operating frequency of the oscillator circuit is low.

In a possible design, the first inductor element includes a plurality of conductive segments, and the plurality of conductive segments form an 8-shaped physical loop in a manner of layer-hopping cross. “8-shaped” herein may be understood as: a geometric shape including two rings or approximate rings (for example, polygons) that form an 8 shape, both of the two geometric shapes are of an axisymmetric structure, and the two geometric shapes may be closed shapes or may be non-closed shapes. Each conductive segment herein may be understood as an inductor with two terminals. For example, each conductive segment may be one coil with two terminals. Similarly, the second inductor element may also be an 8-shaped physical loop. The 8-shaped physical loop is constructed, so that inductors in the 8-shaped physical loop have a good anti-interference function. For example, the “manner of layer-hopping cross” may be understood as: The plurality of conductive segments may be separately cabled to the top metal layer and a sub-top metal layer, or may be separately cabled to the top metal layer and a redistribution layer. For example, the 8-shaped physical loop may be divided into a non-crossing part and two crossing parts during cabling. The non-crossing part and one of the two crossing parts may be cabled to the top metal layer, and the other crossing part may be cabled to the sub-top metal layer or the redistribution layer. The plurality of conductive segments may be alternatively cabled to another metal layer.

According to a second aspect, an oscillator circuit is provided, including a first oscillator, a second oscillator, and a switch matrix. The switch matrix changes a coupling coefficient between a first inductor element of the first oscillator and a second inductor element of the second oscillator by controlling relative current directions of the first oscillator and the second oscillator. The switch matrix is configured to: when the relative current directions of the first oscillator and the second oscillator are the same, control the coupling coefficient to be greater than zero. The switch matrix is configured to: when the relative current directions of the first oscillator and the second oscillator are opposite, control the coupling coefficient to be less than zero. For beneficial effects of the second aspect, refer to the first aspect.

In a possible design, the first oscillator includes a first transconductance amplifier, a second transconductance amplifier, and a first resonator. The second oscillator includes a third transconductance amplifier, a fourth transconductance amplifier, and a second resonator. The first resonator includes a first capacitor element and a first inductor element, the second resonator includes a second capacitor element and a second inductor element, and the first inductor element is coupled to the second inductor element. The switch matrix includes a first switch, a second switch, a third switch, and a fourth switch. The first switch is coupled to an output port of the first transconductance amplifier and an output port of the third transconductance amplifier. The second switch is coupled to the output port of the first transconductance amplifier and an output port of the fourth transconductance amplifier. The third switch is coupled to an output port of the second transconductance amplifier and the output port of the third transconductance amplifier. The fourth switch is coupled to the output port of the second transconductance amplifier and the output port of the fourth transconductance amplifier.

In a possible design, when the first switch and the fourth switch are turned on, the second switch and the third switch are turned off, or when the first switch and the fourth switch are turned off, the second switch and the third switch are turned on.

In a possible design, when the first switch and the fourth switch are turned on, and the second switch and the third switch are turned off, a phase of the output port of the first transconductance amplifier is the same as a phase of the output port of the third transconductance amplifier, a phase of the output port of the second transconductance amplifier is the same as a phase of the output port of the fourth transconductance amplifier, and relative current directions of the first inductor element and the second inductor element are the same; or when the first switch and the fourth switch are turned off, and the second switch and the third switch are turned on, a phase of the output port of the first transconductance amplifier is the same as a phase of the output port of the fourth transconductance amplifier, a phase of the output port of the second transconductance amplifier is the same as a phase of the output port of the third transconductance amplifier, and relative current directions of the first inductor element and the second inductor element are opposite.

In a possible design, both the first oscillator and the second oscillator are of differential signal structures. The first oscillator includes a first differential input port and a first differential output port, the first differential input port includes a first input port and a second input port, and the first differential output port includes a first output port and a second output port. The first input port is coupled to an input port of the first transconductance amplifier, the second input port is coupled to an input port of the second transconductance amplifier, the first output port is coupled to the output port of the first transconductance amplifier, and the second output port is coupled to the output port of the second transconductance amplifier. The second oscillator includes a second differential input port and a second differential output port, the second differential input port includes a third input port and a fourth input port, and the second differential output port includes a third output port and a fourth output port. The third input port is coupled to an input port of the third transconductance amplifier, the fourth input port is coupled to an input port of the fourth transconductance amplifier, the third output port is coupled to the output port of the third transconductance amplifier, and the fourth output port is coupled to the output port of the fourth transconductance amplifier.

In a possible design, the first inductor element includes the first input port, the second input port, the first output port, and the second output port. The second inductor element includes the third input port, the fourth input port, the third output port, and the fourth output port.

In a possible design, the first capacitor element is coupled between the first input port and the second input port, and the second capacitor element is coupled between the third input port and the fourth input port.

In a possible design, the oscillator circuit further includes a third capacitor element and a fourth capacitor element, the third capacitor element is coupled between the first output port and the fourth output port, and the fourth capacitor element is coupled between the second output port and the third output port.

In a possible design, a main coil of each of the first inductor element and the second inductor element includes a plurality of metal layers.

In a possible design, the first inductor element and the second inductor element overlap each other.

In a possible design, the first inductor element includes a plurality of conductive segments, and the plurality of conductive segments form an 8-shaped physical loop.

According to a third aspect, a PLL system is further provided, and the PLL system includes the oscillator circuit according to the first aspect and/or the second aspect.

According to a fourth aspect, an electronic device is further provided, and the electronic device may include a processor and a transceiver. The processor is coupled to the transceiver, and the transceiver includes the oscillator circuit according to any one of the first aspect and/or the second aspect, and the possible designs thereof.

In a possible design, a memory is further included, and the processor and the memory are coupled to the transceiver.

DETAILED DESCRIPTION OF ILLUSTRATIVE EMBODIMENTS

The following describes technical solutions in embodiments of this application with reference to the accompanying drawings in embodiments of this application. In the descriptions of embodiments of this application, unless otherwise specified, "/" indicates "or". For example, A/B may indicate A or B. In this specification, "and/or" merely describes an association relationship for describing associated objects, and indicates that three relationships may exist. For example, A and/or B may represent the following three cases: Only A exists, both A and B exist, and only B exists. In addition, in the descriptions in embodiments of this application, "a plurality of" means two or more.

The terms "first" and "second" mentioned in the following are merely intended for a purpose of description, and shall not be understood as an indication or implication of relative importance or implicit indication of the number of indicated technical features. Therefore, a feature limited by "first" or "second" may explicitly or implicitly include one or more features. In the description of embodiments of the present invention, unless otherwise stated, "a plurality of" means two or more than two.

Embodiments of this application can be applied to a PLL of a radio frequency chip.

Figure 1:
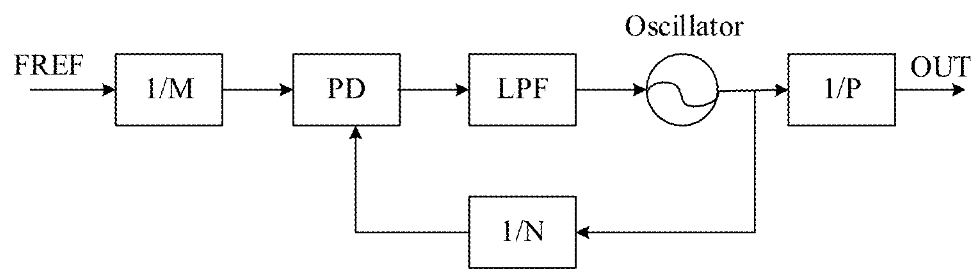
FIG. 1 is a schematic diagram of a structure of a PLL system according to an embodiment of this application.

As shown in FIG. 1, a PLL system may include components such as a phase detector (PD), a loop filter (LPF), an oscillator, and a frequency divider. The PD may be configured to: detect a phase difference between an input signal and an output signal, and convert a detected phase difference signal into a voltage signal for output. After being filtered by the LPF, the signal forms a control voltage of the oscillator, and controls a frequency of a signal output by the oscillator.

The PD may be alternatively replaced with a combination of a phase frequency detector (PFD) and a charge pump (CP). The oscillator may be a voltage controlled oscillator (VCO), a digitally controlled oscillator (DCO), or another type of oscillator.

The VCO is used as an example.

The PFD is configured to: perform discrete time sampling on a phase difference between a reference frequency input to the PLL and a frequency fed back by the frequency divider, to obtain a discrete time phase difference signal, that is, a result of phase frequency detection, and input the result of phase frequency detection to the CP.

The CP is configured to convert the discrete time phase difference signal obtained through sampling by the PFD into a discrete time charge signal.

The LPF is configured to integrate and maintain or filter the discrete time charge signal output by the CP, and then output a voltage signal.

The VCO is configured to obtain an expected signal frequency and phase based on the voltage signal output by the LPF.

The frequency divider includes a pre-divider 1/M, a post-divider 1/P, and a feedback divider 1/N. The pre-divider 1/M is configured to divide an input reference frequency and input a divided frequency to the PFD, the post-divider 1/P is configured to divide a frequency of the oscillator and output a divided frequency, and the feedback divider 1/N is configured to divide a feedback frequency and input a divided frequency to the PFD.

With reference to FIG. 1, an output port of the pre-divider 1/M is connected to an input port of the PFD, an output port of the PFD is connected to an input port of the CP, an output port of the CP is connected to an input port of the LPF, an output port of the LPF is connected to an input port of the oscillator, an output port of the oscillator is connected to an input port of the post-divider 1/P, the output port of the oscillator is further connected to an input port of the feedback divider 1/N, and an output port of the feedback divider 1/N is connected to another input port of the PFD.

The PLL system can be applied to technologies such as a clock tree and a frequency synthesizer. For example, in the clock tree technology, for a digital circuit clock in the clock tree technology, either a synchronization circuit or an asynchronization circuit requires a stable clock signal to perform transmission, operation, storage, and the like on digital information of the synchronization circuit and the asynchronization circuit. The PLL system may be configured to generate the stable clock signal. In the frequency synthesizer in a wireless communication system, a signal is transmitted at a specific frequency, and the PLL system may be configured to generate an accurate clock signal.

The PLL system is widely used in various types of chips, such as a processor chip and a radio frequency chip, of a base station device or a terminal device.

The oscillator in the PLL system plays a key role in a communication system, and provides a required periodic signal for timing in a digital circuit and frequency conversion in an RF circuit. The oscillator may be implemented as an independent module separated from another circuit or integrated into an application-specific integrated circuit (ASIC) for use in devices. These devices are, for example without limitation to, a mobile phone, a base station, and almost every communication device.

Figure 2:
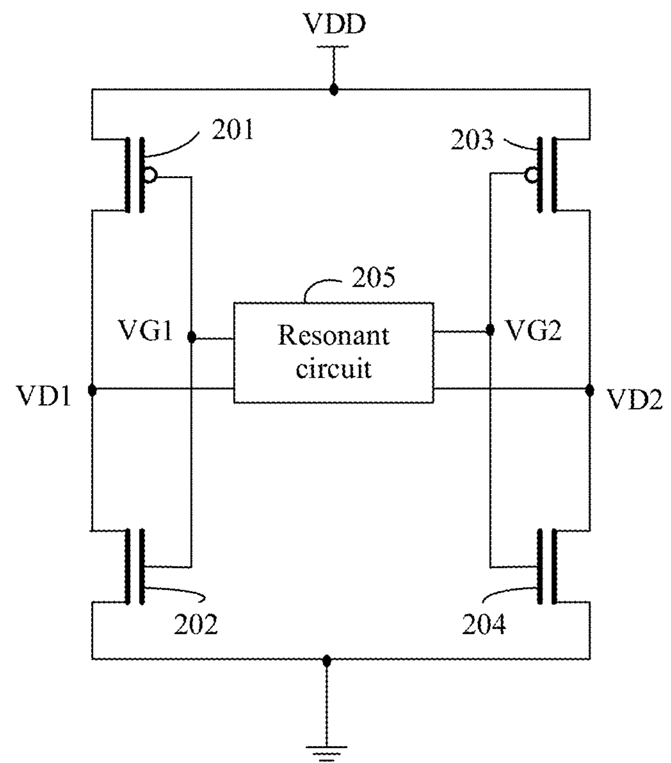
FIG. 2 is a schematic diagram of a differential structure of a VCO according to an embodiment of this application.

The following first describes a structure of the oscillator. FIG. 2 is a schematic diagram of a differential structure of a VCO. The VCO may include two transconductance amplifiers and a resonant circuit 205, one transconductance amplifier may include a PMOS transistor 201 and an NMOS transistor 202, and the other transconductance amplifier may include a PMOS transistor 203 and an NMOS transistor 204. Sources of the PMOS transistors 201 and 203 are coupled to a positive power rail (VDD), and gates thereof are coupled to gates of the NMOS transistors 202 and 204. The gates of the PMOS transistor 201 and the NMOS transistor 202 are coupled to a terminal VG1 of the resonant circuit 205. The gates of the PMOS transistor 203 and the NMOS transistor 204 are coupled to a terminal VG2 of the resonant circuit 205. Sources of the NMOS transistors 202 and 204 are coupled to a negative power rail (a ground cable), and drains thereof are coupled to drains of the PMOS transistor 201 and the PMOS transistor 203. A terminal VD1 of the resonant circuit 205 is coupled to the drain of the PMOS transistor 201 and the drain of the NMOS transistor 202, and a terminal VD2 of the resonant circuit 205 is coupled to the drain of the PMOS transistor 203 and the drain of the NMOS transistor 204.

If the differential structure of the VCO shown in FIG. 2 is coupled to the PLL system shown in FIG. 1, two capacitor elements connected in series may be coupled between the input terminals VG1 and VG2 of the resonant circuit in the differential structure, and the output port of the LPF may be coupled between the two capacitor elements connected in series. Then, the output terminals VD1 and VD2 in the differential structure are coupled to a buffer (BUF) circuit, and an output port of the BUF circuit is coupled to the input port of the frequency divider.

Figure 3:
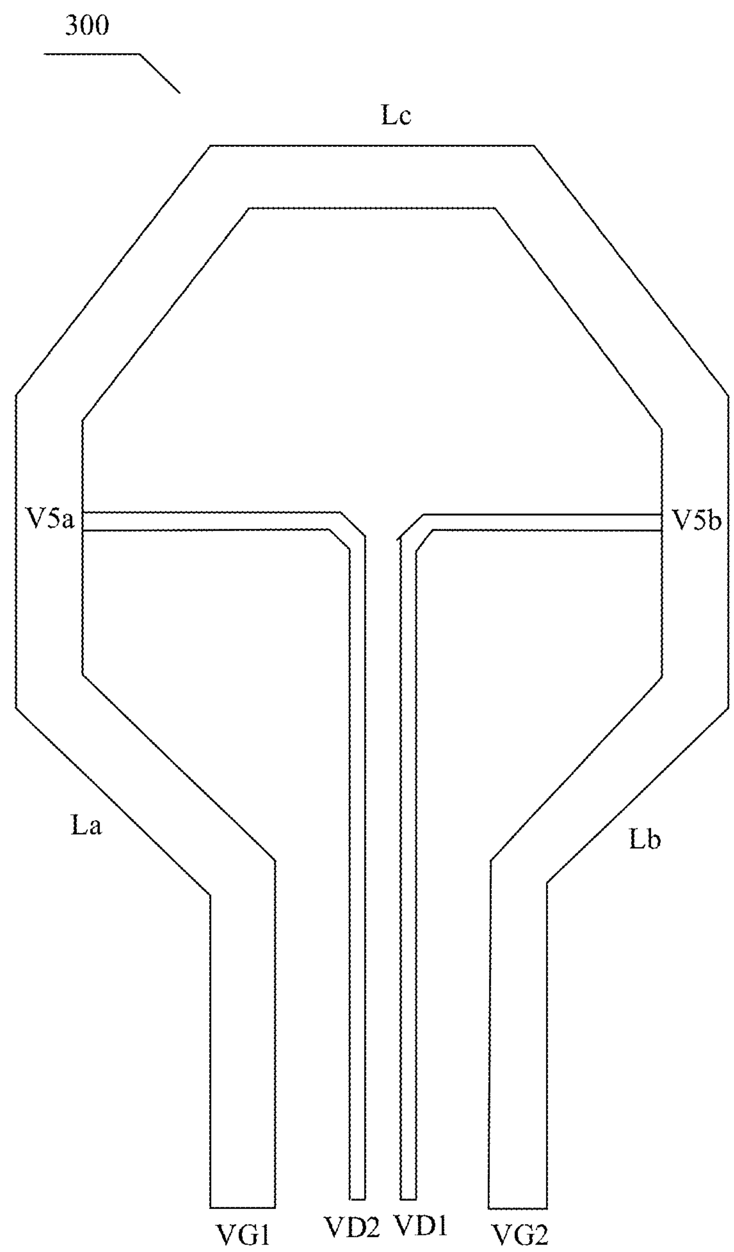
FIG. 3 shows an example layout of an inductor element according to an embodiment of this application.
Figure 4:
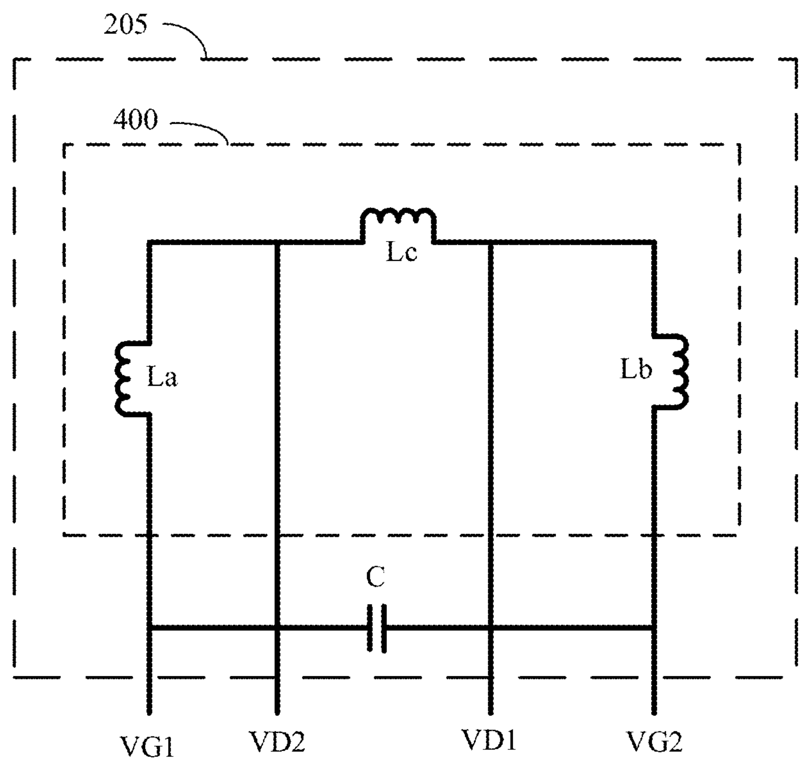
FIG. 4 is an ideal schematic diagram of an inductor element in a resonant circuit and a capacitor element coupled in parallel to the inductor element according to an embodiment of this application.
Figure 5:
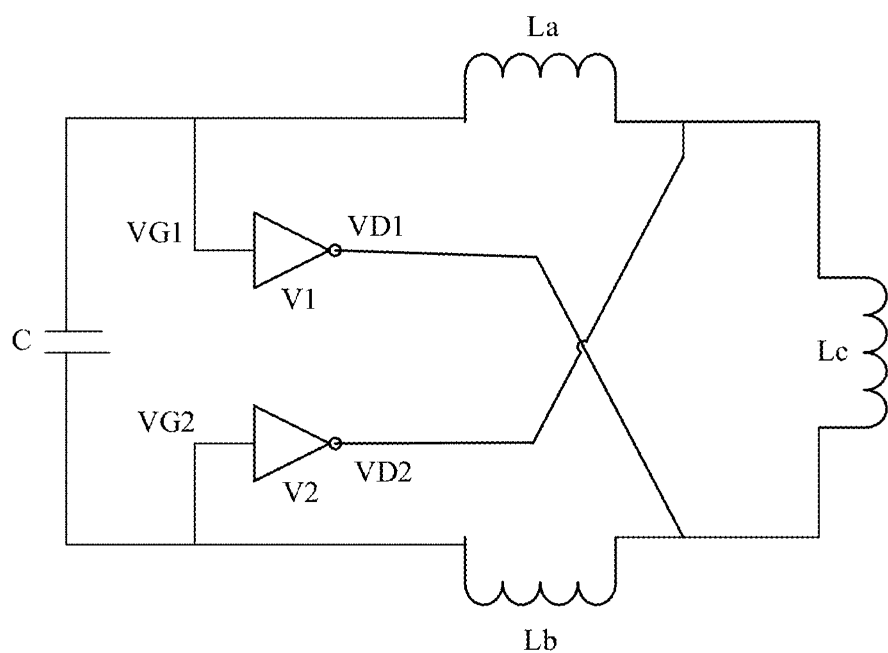
FIG. 5 is a schematic diagram of an equivalent circuit of a VCO according to an embodiment of this application.

The resonant circuit 205 may include a capacitor element and an inductor element, and the inductor element may have the foregoing terminals VG1, VG2, VD1, and VD2. An example layout of the inductor element may be shown in FIG. 3. FIG. 4 is an ideal schematic diagram of an inductor element in the resonant circuit 205 and a capacitor element C coupled in parallel to the inductor element. An inductor element 300 in FIG. 3 is equivalent to an inductor element 400 in FIG. 4. Conductive segments VG1-V5*a*, VG2-V5*b*, and V5*a*-V5*b* of the inductor element 300 in FIG. 3 respectively correspond to inductors La, Lb, and Lc in the schematic diagram of FIG. 4. With reference to FIG. 3 and FIG. 4, an equivalent circuit of the VCO shown in FIG. 2 may be alternatively shown in FIG. 5. The PMOS transistor 201 and the NMOS transistor 202 in FIG. 2 may correspond to V1 in FIG. 5, and the PMOS transistor 203 and the NMOS transistor 204 in FIG. 2 correspond to V2 in FIG. 5. This VCO in the structure shown in FIG. 4 and FIG. 5 can reduce phase noise of the oscillator circuit, and improve performance of the oscillator circuit. However, this VCO in the structure has a small operating frequency range.

The inductor element 300 includes one or more inductor segments (such as VG1-V5*a*, VG2-V5*b*, and V5*a*-V5*b*) that form a physical loop. The term "physical loop" used in this specification refers to a closed or approximately closed geometric shape that has a co-located or adjacent start point and an end point and that includes at least one noticeable convex portion, where the convex portion defines internal space within the convex portion (for example, a ring polygon or a ring polygon segment). Therefore, the physical loop is different from an "electrical loop". The electrical loop usually represents a closed path of any shape in which a current may flow.

The physical loop is symmetrical, and is shown as an approximate octagon when the physical loop is in the inductor element 300. Without departing from the scope of this application, a person skilled in the art appreciates that the physical loop may include other symmetrical and asymmetric shapes (such as a rectangle, a square, and a hexagon). The inductor element 300 is connected to the segments VD2-V5*a* and VD1-V5*b* respectively at V5*a* and V5*b* by using an electrical connection apparatus to form electrical loops. These electrical loops are disposed in internal space formed by the physical loop (including La, Lb, and Lc).

The capacitor element C may be embodied as a PMOS varactor diode, an NMOS varactor diode, a metal-insulator-metal (MIM) device, or any other suitable capacitor element. In a silicon process, two types of varactor diodes may be used, that is, a reverse bias pn junction diode or a MOSFET varactor. The MOSFET varactor may include a MOS transistor, where a drain connector, a source connector, and a body connector of the MOS transistor are coupled together, and a capacitance is adjusted based on a voltage applied between the body connector and a gate connector. Without departing from the scope of this application, a person skilled in the art appreciates that the capacitor element C may be replaced by another element.

A quality factor (Q) of the resonant circuit 205 depends on the inductor 300 with a low resistance. A series resistance is reduced by using a thick/wide metallization process, for example without limitation to, aluminum, copper, gold, or another suitable material, thereby minimizing a resistance of the inductor 300. The inductor 300 includes a high dielectric substrate material such as silicon, gallium arsenide, or another suitable material. A surface micromachining technology may be used to generate an air gap between the inductor and the substrate, so as to further improve dielectric performance.

Figure 6:
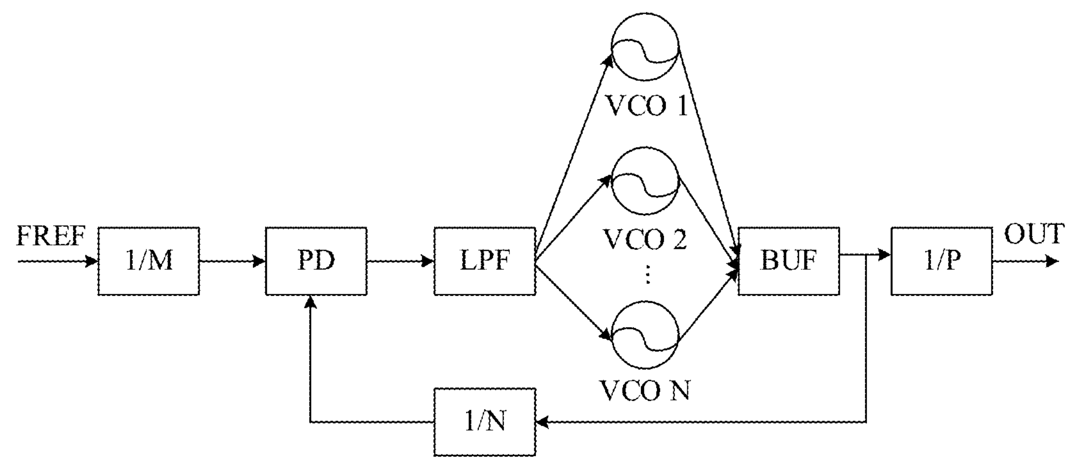
FIG. 6 is a schematic diagram of a structure of a PLL system according to an embodiment of this application.
Figure 7:
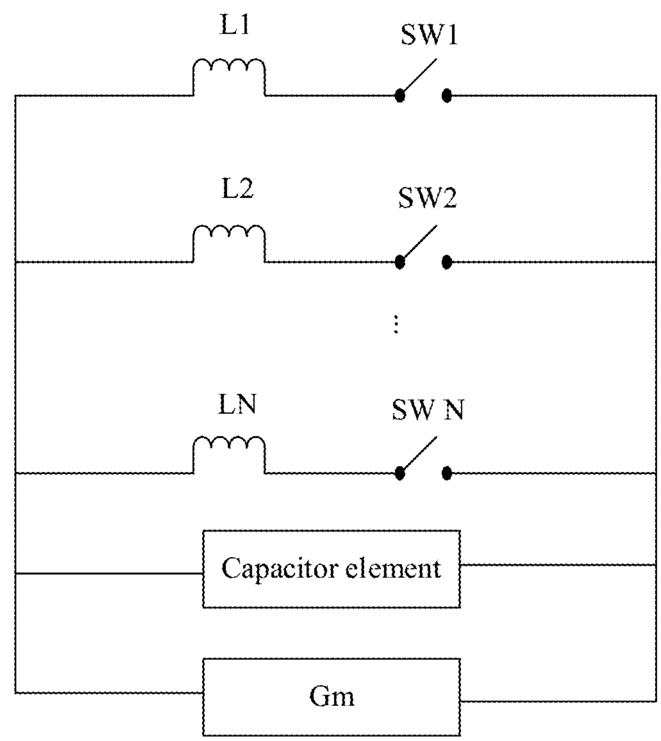
FIG. 7 is a schematic diagram of a structure of a VCO according to an embodiment of this application.

Based on understanding of the foregoing circuit structure of the VCO, as shown in FIG. 6, one PLL system usually integrates a plurality of VCOs, and a BUF circuit is coupled following the plurality of VCOs, to meet requirements on frequency coverage, noise, and power consumption. However, integration of the plurality of VCOs increases a PLL area and increases chip costs. In addition, the integrated inductor in the VCO needs large avoidance space, increasing complexity of chip routing. In addition, frequency coverage areas of the VCOs need to overlap each other to counteract a process deviation. This decreases a quality factor of the VCO and increases power consumption. In another PLL system, a design of a VCO in the PLL system may be shown in FIG. 7. A switch may be connected in series to each inductor segment. Through switching of a switch, an inductor segment that is connected to the VCO varies, and a corresponding operating frequency of the VCO varies. However, in this design, because one switch is connected in series to each inductor, a quality factor and phase noise of the inductor are deteriorated, and an equivalent parallel resistance of a resonant network is reduced, thereby increasing power consumption of the VCO.

Therefore, this application provides an improvement to the oscillator circuit, so that the PLL system can cover, by integrating one oscillator circuit, a wider frequency range than a conventional oscillator structure. This helps reduce a chip area, thereby reducing chip costs and power consumption. A basic principle of the oscillator circuit may be as follows: A current direction control module is coupled between two independent oscillators, and the current direction control module may be implemented by using a switch matrix. Different switch combinations in the switch matrix are controlled to be turned on or off, so that a phase of a turned-on switch can be the same as a phase of a terminal coupled to the oscillator, thereby changing a relative current direction of a resonance loop of the two independent oscillators, changing a polarity of interaction between two inductor elements coupled in the two oscillators, and changing a coupling coefficient between the inductor elements. In this way, a frequency coverage area of the oscillator is expanded.

Figure 8:
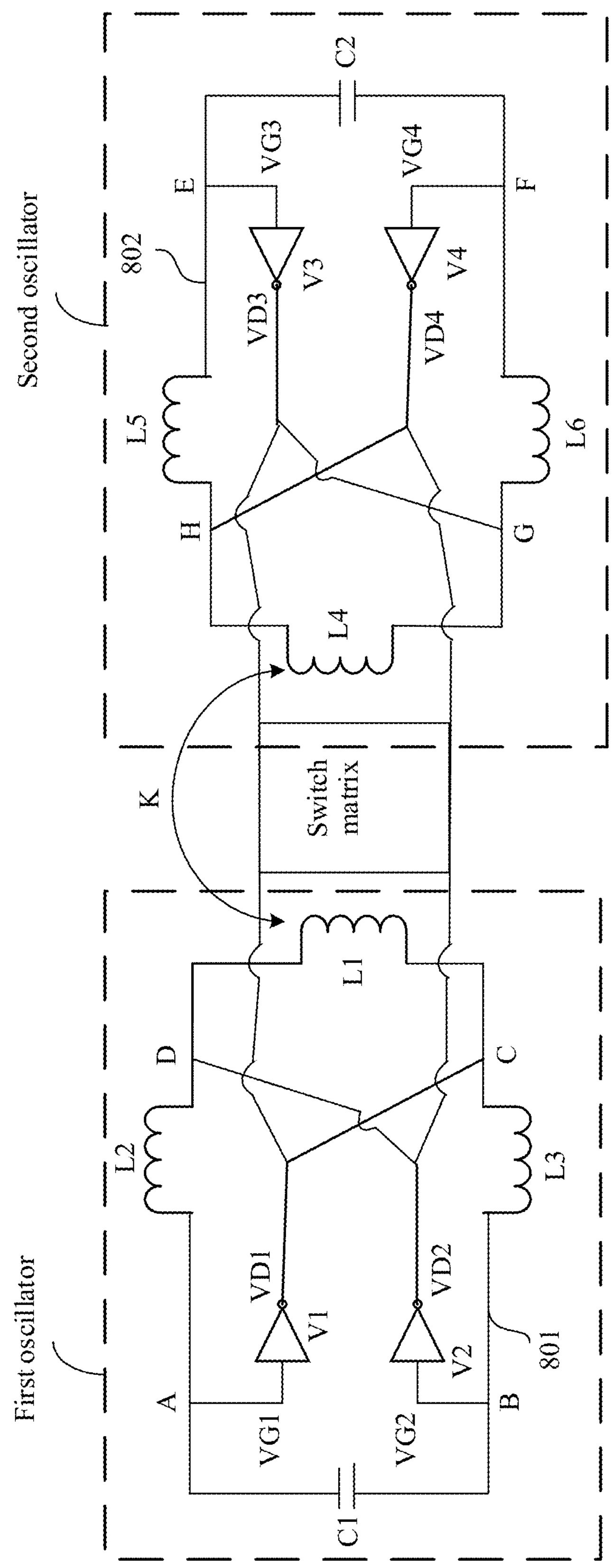
FIG. 8 is a schematic diagram of a structure of an oscillator circuit according to an embodiment of this application.

Based on the foregoing description, this application provides an oscillator circuit 800. With reference to FIG. 8, the oscillator circuit may include a first oscillator, a second oscillator, and a switch matrix.

The first oscillator includes a first transconductance amplifier V1, a second transconductance amplifier V2, and a first resonator.

The second oscillator includes a third transconductance amplifier V3, a fourth transconductance amplifier V4, and a second resonator.

The first resonator includes a first capacitor element C1 and a first inductor element 801, the second resonator includes a second capacitor element C2 and a second inductor element 802, and the first inductor element 801 is coupled to the second inductor element 802.

The switch matrix is coupled between the first oscillator and the second oscillator. By controlling relative current directions of the first inductor element 801 and the second inductor element 802, a coupling coefficient between the first inductor element 801 and the second inductor element 802 can be changed, thereby changing an operating frequency of the oscillator.

For example, VCOs in the first oscillator and the second oscillator may be DCOs or in another type, or may be a separate structure.

With reference to FIG. 8, the first oscillator includes a first differential input port and a first differential output port, the first differential input port includes a first input port A and a second input port B, and the first differential output port includes a first output port C and a second output port D. The first input port A is coupled to an input port VG1 of the first transconductance amplifier V1, the second input port B is coupled to an input port VG2 of the second transconductance amplifier V2, the first output port C is coupled to an output port VD1 of the first transconductance amplifier V1, and the second output port D is coupled to an output port VD2 of the second transconductance amplifier V2.

The second oscillator includes a second differential input port and a second differential output port, the second differential input port includes a third input port E and a fourth input port F, and the second differential output port includes a third output port G and a fourth output port H. The third input port E is coupled to an input port VG3 of the third transconductance amplifier V3, the fourth input port F is coupled to an input port VG4 of the fourth transconductance amplifier V4, the third output port G is coupled to an output port VD3 of the third transconductance amplifier V3, and the fourth output port H is coupled to an output port VD4 of the fourth transconductance amplifier V4.

Figure 9:
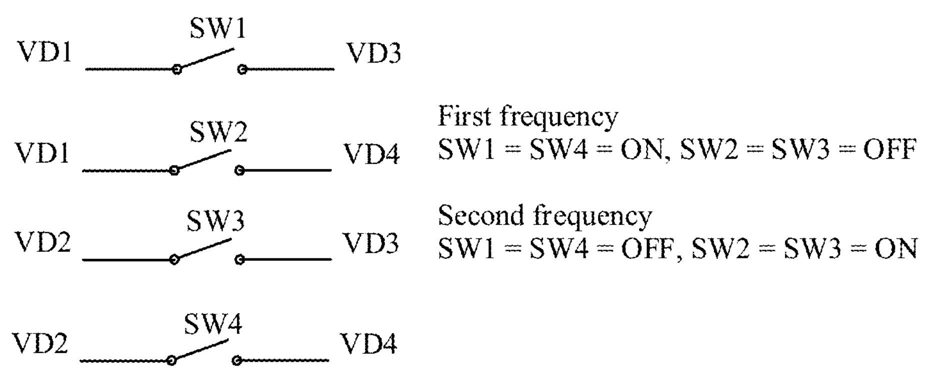
FIG. 9 shows an example structure in which a coupling manner of a switch matrix is independent according to an embodiment of this application.

In some embodiments, for an example coupling manner in which a coupling manner of the switch matrix is independent, refer to FIG. 9. The switch matrix may include a first switch SW1, a second switch SW2, a third switch SW3, and a fourth switch SW4.

The first switch SW1 is coupled to the output port VD1 of the first transconductance amplifier V1 and the output port VD3 of the third transconductance amplifier V3.

The second switch SW2 is coupled to the output port VD1 of the first transconductance amplifier V1 and the output port VD4 of the fourth transconductance amplifier V4.

The third switch SW3 is coupled to the output port VD2 of the second transconductance amplifier V2 and the output port VD3 of the third transconductance amplifier V3.

The fourth switch SW4 is coupled to the output port VD2 of the second transconductance amplifier V2 and the output port VD4 of the fourth transconductance amplifier V4.

The first inductor element 801 may include the inductors L1, L2, and L3 in FIG. 8, and the second inductor element 802 may include the inductors L4, L5, and L6 in FIG. 8.

Figure 9A:
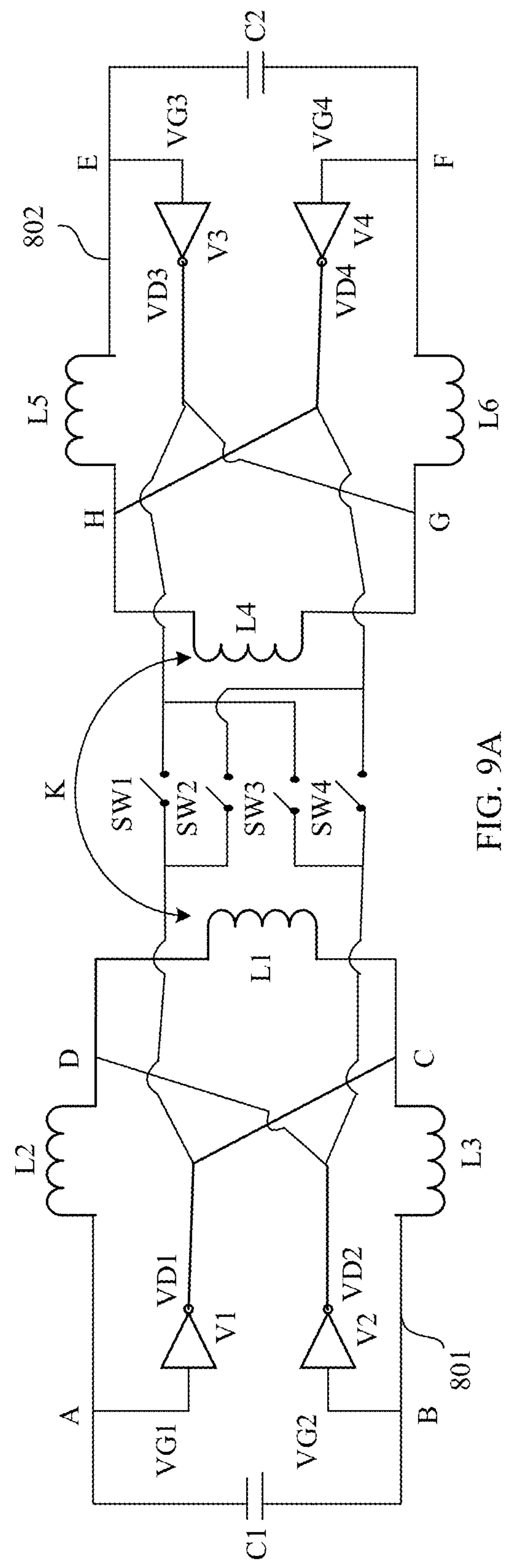
FIG. 9A is a schematic diagram of a structure of an oscillator circuit according to an embodiment of this application.

With reference to FIG. 8 and FIG. 9, the oscillator circuit 800 shown in FIG. 9A can be obtained.

The foregoing current direction control module is equivalent to the switch matrix shown in FIG. 8 or FIG. 9. To be specific, the switch matrix is configured to control relative current directions of resonance loops of two independent oscillators and phases at both ends of the switch matrix, to control an operating frequency of the oscillator circuit 800.

The switch in the switch matrix may be a plurality of combinations of an NMOS transistor, a PMOS transistor, and a CMOS transistor.

When a turned-on switch combination and a turned-off switch combination in the switch matrix are changed, an active circuit of the oscillator circuit 800 may inject a current in different manners to an oscillation loop, so that relative current directions of the first inductor element 801 and the second inductor element 802 are the same or different. A change of the relative current direction can make a coupling coefficient between the first inductor element 801 and the second inductor element 802 different. In this way, an operating frequency of the oscillator circuit 800 can also be accordingly changed based on a reverse relationship between a coupling coefficient and an operating frequency. To be specific, when the coupling coefficient increases, the operating frequency decreases, and when the coupling coefficient decreases, the operating frequency increases.

In some embodiments, the switch matrix is configured to: when the relative current directions of the first inductor element 801 and the second inductor element 802 are the same (for example, current directions shown in FIG. 10), control the coupling coefficient between the first inductor element 801 and the second inductor element 802 to be greater than 0, and the oscillator circuit to operate at a first frequency.

The switch matrix is configured to: when the relative current directions of the first inductor element 801 and the second inductor element 802 are opposite (for example, current directions shown in FIG. 12), control the coupling coefficient between the first inductor element 801 and the second inductor element 802 to be less than 0, and the oscillator circuit to operate at a second frequency, where the second frequency is higher than the first frequency.

It should be understood that the first frequency may be understood as a low frequency, and the second frequency may be understood as a high frequency.

That the relative current directions are the same may be understood as that a direction in which a current in the first oscillator sequentially flows through the inductor L2 into the inductor L1 and then enters the inductor L3 is a clockwise current direction, and a direction in which a current in the second oscillator sequentially flows through the inductor L5 into the inductor L4 and then enters the inductor L6 is a counterclockwise current direction.

That the relative current directions are opposite may be understood as that a direction in which the current in the first oscillator sequentially flows through the inductor L2 into the inductor L1 and then enters the inductor L3 is the clockwise current direction, and a direction in which the current in the second oscillator sequentially flows through the inductor L6 into the inductor L4 and then enters the inductor L5 is also the clockwise current direction. In some embodiments, according to the oscillator circuit Boo shown in FIG. 8, when the relative current directions are controlled, control signals of the first switch SW1 and the fourth switch SW4 are the same, and control signals of the second switch SW2 and the third switch SW3 are the same.

For example, when the first switch SW1 and the fourth switch SW4 are turned on, the second switch SW2 and the third switch are turned off.

When the first switch SW1 and the fourth switch SW4 are turned off, the second switch SW2 and the third switch SW3 are turned on.

Figure 10:
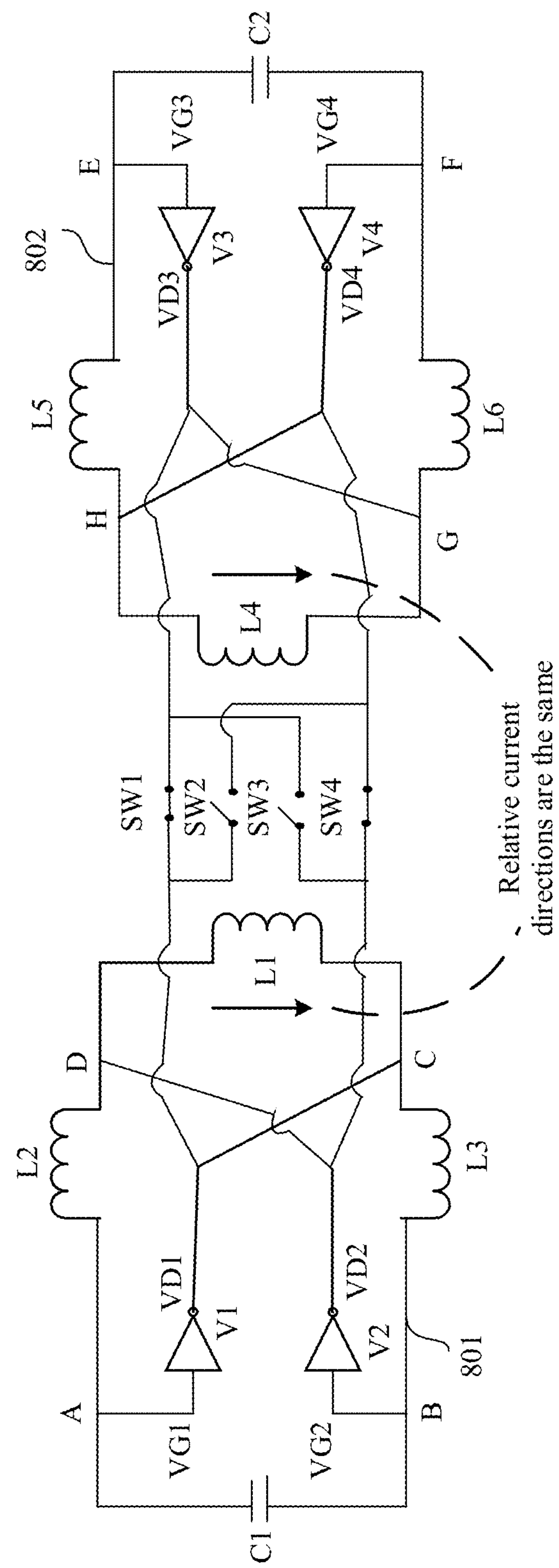
FIG. 10 is a schematic diagram of a structure of an oscillator circuit according to an embodiment of this application.

When the first switch SW1 and the fourth switch SW4 are turned on, and the second switch SW2 and the third switch SW3 are turned off, the oscillator circuit 800 shown in FIG. 8 may be converted into an oscillator circuit 100 shown in FIG. 10.

It can be learned that, when the first switch SW1 and the fourth switch SW4 are turned on, and the second switch SW2 and the third switch SW3 are turned off, a phase of the output port VD1 of the first transconductance amplifier V1 is the same as a phase of the output port VD3 of the third transconductance amplifier V3, a phase of the output port VD2 of the second transconductance amplifier V2 is the same as a phase of the output port VD4 of the fourth transconductance amplifier V4, and the relative current directions of the first inductor element 801 and the second inductor element 802 are the same.

Figure 11:
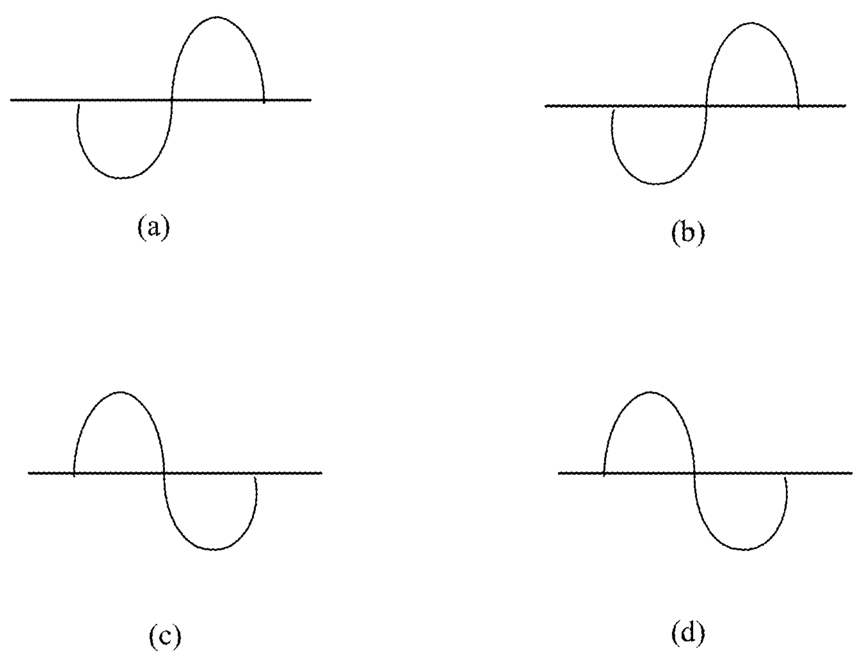
FIG. 11 is a schematic diagram of comparing phases of output ports of transconductance amplifiers according to an embodiment of this application.

With reference to FIG. 11, it is assumed that when a phase of the output port VD1 of the first transconductance amplifier V1 is shown in (a) in FIG. 11, a phase of the output port VD3 of the third transconductance amplifier V3 is shown in (b) in FIG. 11. That is, the phases of VD1 and VD3 are the same. Similarly, with reference to FIG. 11, it is assumed that when a phase of the output port VD2 of the second transconductance amplifier V2 is shown in (c) in FIG. 11, a phase of the output port VD4 of the fourth transconductance amplifier V4 is shown in (d) in FIG. 11. That is, the phases of VD2 and VD4 are the same.

In this case, still refer to FIG. 10. When the phases of VD1 and VD3 are the same, and the phases of VD2 and VD4 are the same (for example, in a differential structure, that phases of two terminals are the same may be understood as that a phase difference between the two terminals is 0°, and that phases of two terminals are inverse may be understood as that a phase difference between the two terminals is 180°. It should be considered that 0 degrees and 180 degrees herein may have a specific implementation tolerance in terms of engineering implementation), the relative current directions of the first inductor element 801 and the second inductor element 802 are the same. A coupling action between the inductor L1 and the inductor L4 enables a coupling coefficient K between L1 and L4 to be greater than 0. In this case, if inductances of the inductors L2, L3, L5, and L6 are ignored, an operating frequency $F_{osc}$ of the oscillator circuit 800 may be represented as Formula 1:

$$F_{osc} = \frac{1}{2\pi\sqrt{(L1 + K\sqrt{L1L4})C1}} = \frac{1}{2\pi\sqrt{(L4 + K\sqrt{L1L4})C2}}, \quad \text{(Formula 1)}$$

where

C1 in Formula 1 represents a capacitance of the first capacitor element C1, C2 in Formula 1 represents a capacitance of the second capacitor element C2, L1 in Formula 1 represents an inductance of the inductor L1, and L4 in Formula 1 represents an inductance of the inductor L4. It should be understood that, usually, functionally symmetric inductors in the first oscillator and the second oscillator have a same inductance, and functionally symmetric capacitor elements thereof have a same capacitance. In some embodiments, the capacitance of the first capacitor element C1 is the same as the capacitance of the second capacitor element C2, and the inductance of the inductor L1 is the same as the inductance of the inductor L4. $F_{osc}$ may represent the operating frequency of the oscillator circuit 800, may represent an operating frequency of the first oscillator, or may represent an operating frequency of the second oscillator.

Because the coupling coefficient is greater than 0, it may be considered that the operating frequency $F_{osc}$ is low in this case, and the oscillator circuit 800 operates in a low-frequency mode.

Figure 12:
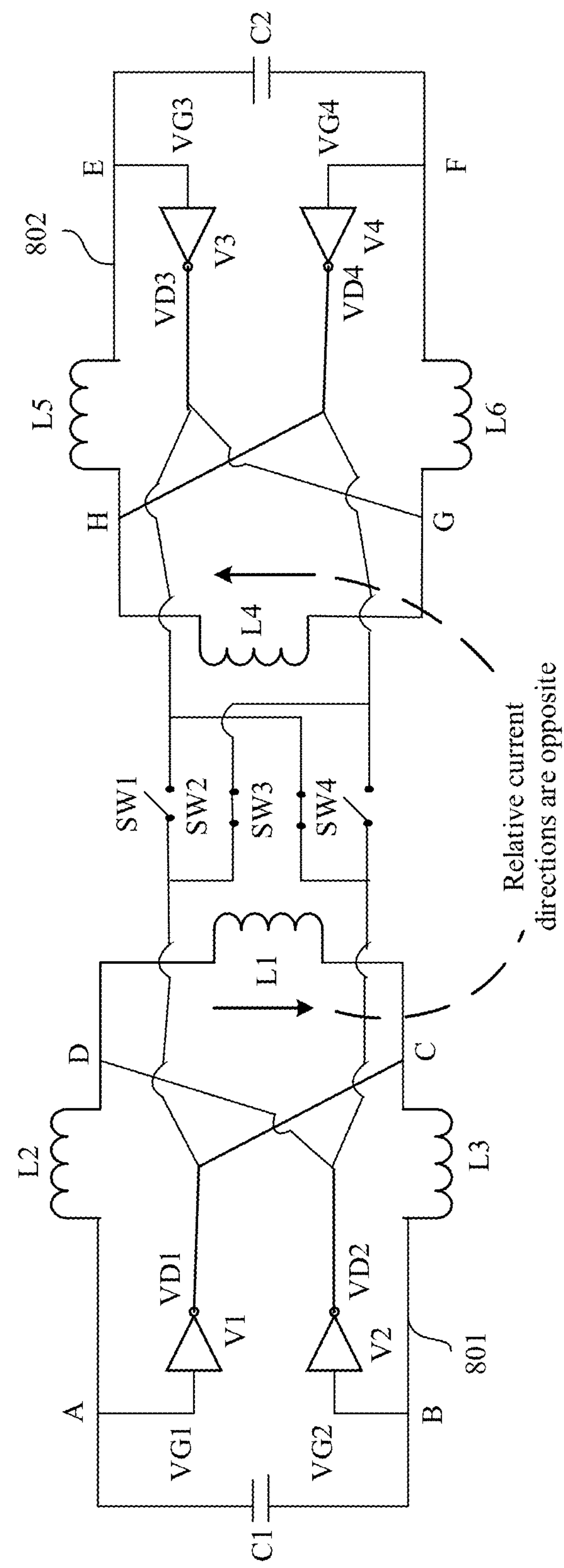
FIG. 12 is a schematic diagram of a structure of an oscillator circuit according to an embodiment of this application.

When the first switch SW1 and the fourth switch SW4 are turned off, and the second switch SW2 and the third switch SW3 are turned on, the oscillator circuit 80*o* shown in FIG. 8 may be converted into an oscillator circuit 120 shown in FIG. 12.

It can be learned that, when the first switch SW1 and the fourth switch SW4 are turned off, and the second switch SW2 and the third switch SW3 are turned on, a phase of the output port VD1 of the first transconductance amplifier V1 is the same as a phase of the output port VD4 of the fourth transconductance amplifier V4, a phase of the output port VD2 of the second transconductance amplifier V2 is the same as a phase of the output port VD3 of the third transconductance amplifier V3, and the relative current directions of the first inductor element 801 and the second inductor element 802 are opposite.

With reference to FIG. 11, it is assumed that when a phase of the output port VD1 of the first transconductance amplifier V1 is shown in (a) in FIG. 11, a phase of the output port VD4 of the fourth transconductance amplifier V4 is shown in (b) in FIG. 11. That is, the phases of VD1 and VD4 are the same. Similarly, with reference to FIG. 11, it is assumed that when a phase of the output port VD2 of the second transconductance amplifier V2 is shown in (c) in FIG. 11, a phase of the output port VD3 of the third transconductance amplifier V3 is shown in (d) in FIG. 11. That is, the phases of VD2 and VD3 are the same.

$$Fosc'F_{osc'} = \frac{1}{2\pi\sqrt{(L1 + K'\sqrt{L1L4})C1}} = \frac{1}{2\pi\sqrt{(L4 + K'\sqrt{L1L4})C2}}$$

In this case, still refer to FIG. 12. When the phases of VD1 and VD4 are the same, the phases of VD2 and VD3 are the same, and the relative current directions of the first inductor element 801 and the second inductor element 802 are the same, a coupling action between the inductor L1 and the inductor L4 enables a coupling coefficient K' between L1 and L4 to be less than 0. In this case, if inductances of the inductors L2, L3, L5, and L6 are ignored, an operating frequency of the oscillator circuit 800 may be represented as Formula 2:

$$Fosc'F_{osc'} = \frac{1}{2\pi\sqrt{(L1 + K'\sqrt{L1L4})C1}} = \frac{1}{2\pi\sqrt{(L4 + K'\sqrt{L1L4})C2}} \quad \text{(Formula 2)}$$

For meanings represented by symbols in Formula 2, refer to the foregoing description of Formula 1.

Similarly, $F_{osc}'$ may represent the operating frequency of the oscillator circuit 800, may represent an operating frequency of the first oscillator, or may represent an operating frequency of the second oscillator.

The coupling coefficient of the oscillator circuit 800 shown in FIG. 12 is less than 0. In comparison with the foregoing calculation result that the coupling coefficient is greater than 0, it can be learned that $F_{osc}'$ is higher than $F_{osc}$ by comparing the operating frequency $F_{osc}'$ of the oscillator circuit 800 when the coupling coefficient is less than 0 with the operating frequency $F_{osc}$ of the oscillator circuit 800 when the coupling coefficient is greater than 0. It may be understood that when the coupling coefficient is less than 0, the oscillator circuit 800 operates in a high-frequency mode.

Therefore, it may be understood that, the switch matrix needs to be used in this application to implement switching of an operating mode. When any switch in the switch matrix is turned on and impedance is low enough, terminals connected to two ends of the switch operate in an in-phase state. When different switch combinations are turned on or off, the relative current directions of the first inductor element 801 in the first oscillator and the second inductor element 802 in the second oscillator can be changed. The change of the current direction can change the coupling coefficient between the first inductor element 801 and the second inductor element 802 that are coupled to each other, thereby changing the operating frequency of the oscillator circuit 800. Therefore, the PLL system in this application can cover, by integrating one oscillator, a wider frequency range than a conventional oscillator circuit structure. This helps reduce an area of a radio frequency chip and a loss caused by a component.

In addition, in this application, a mode switching module (the switch matrix) of the low-frequency mode and the high-frequency mode may be independent of the oscillation loop, thereby helping maintain a high quality factor of the oscillation loop.

Figure 13:
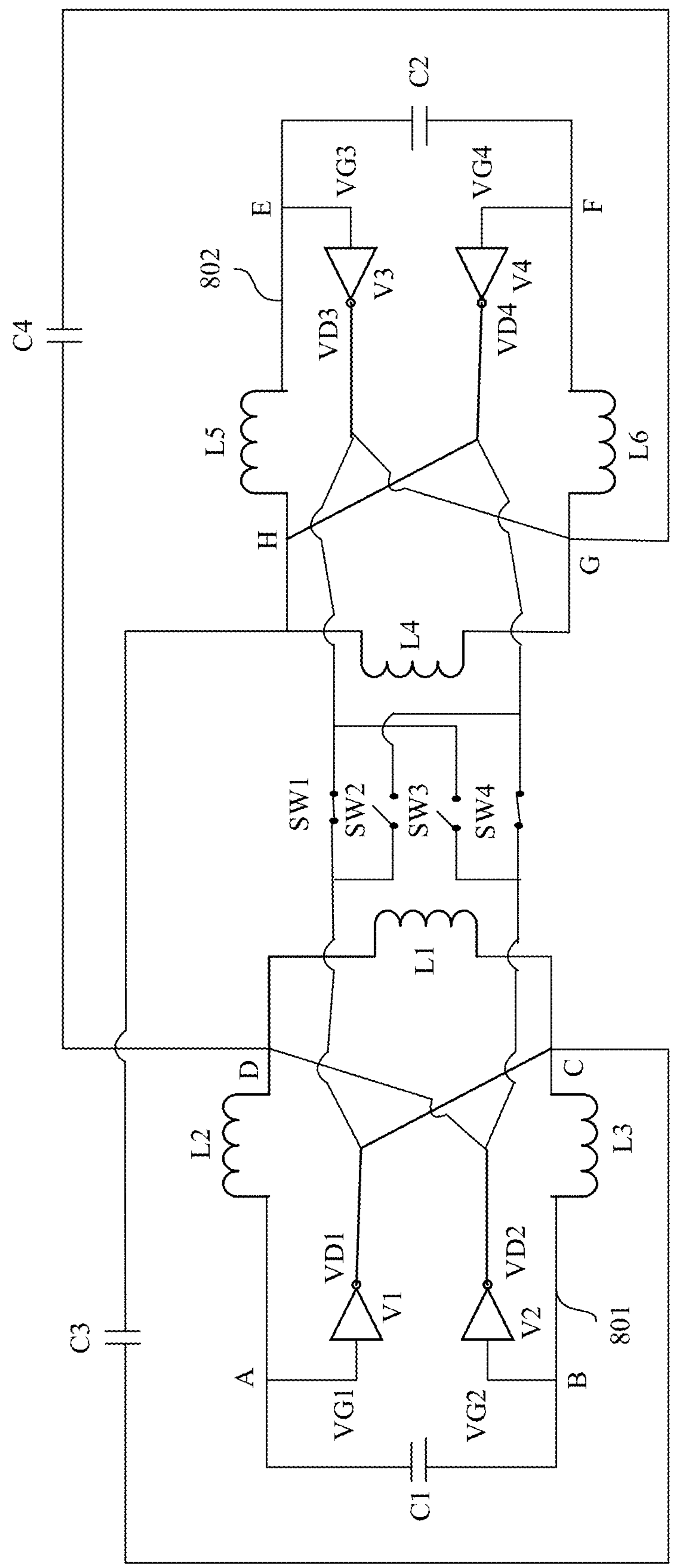
FIG. 13 is a schematic diagram of a structure of an oscillator circuit according to an embodiment of this application.

In some embodiments, with reference to FIG. 13, the oscillator circuit 800 may further include a third capacitor element C3 and a fourth capacitor element C4. The third capacitor element C3 is coupled between the first output port C and the fourth output port H, and the fourth capacitor element C4 is coupled between the second output port D and the third output port G.

Phases of two terminals of each of the third capacitor element C3 and the fourth capacitor element C4 are also related to turning-on and turning-off of the switch combination of the switch matrix, so that the third capacitor element C3 and the fourth capacitor element C4 can be connected to the oscillator circuit 800 and disconnected from the oscillator circuit 800 under control of turning-on and turning-off of different switch combinations. In this way, a wider frequency range can be obtained when the operating frequency of the oscillator circuit 800 is calculated.

For example, when the first switch SW1 and the fourth switch SW4 are turned on, and the second switch SW2 and the third switch SW3 are turned off, a phase of the output port VD1 of the first transconductance amplifier V1 is the same as a phase of the output port VD3 of the third transconductance amplifier V3, and a phase of the output port VD2 of the second transconductance amplifier V2 is the same as a phase of the output port VD4 of the fourth transconductance amplifier V4, but the phase of VD1 (as shown in (a) in FIG. 11) is different from the phase of VD4 (as shown in (d) in FIG. 11). For a phase of the second input port B coupled to the third capacitor element C3, refer to the phase of VD1, and for a phase of the fourth output port H, refer to the phase of VD4. In this case, the phase of the second input port B coupled to the third capacitor element C3 is different from the phase of the fourth output port H, and the third capacitor element C3 is connected to the oscillator circuit 800 in this case.

$$F''_{osc}F_{osc}'' = \frac{1}{2\pi\sqrt{\left(L1 + K\sqrt{L1L4}\right)\left(C1 + \frac{C3}{2} + \frac{C4}{2}\right)}} = \frac{1}{2\pi\sqrt{\left(L4 + K\sqrt{L1L4}\left(C2 + \frac{C3}{2} + \frac{C4}{2}\right)\right.}}$$

When the third capacitor element C3 and the fourth capacitor element C4 are also connected to the oscillator circuit 800, reference is made to a manner in which the operating frequency of the oscillator circuit 800 is calculated according to Formula 1. Formula 1 may be transformed into represented in Formula 3. Formula 3 is $$F''_{osc}F_{osc}'' = \frac{1}{2\pi\sqrt{\left(L1 + K\sqrt{L1L4}\right)\left(C1 + \frac{C3}{2} + \frac{C4}{2}\right)}} = \frac{1}{2\pi\sqrt{\left(L4 + K\sqrt{L1L4}\left(C2 + \frac{C3}{2} + \frac{C4}{2}\right)\right.}} \quad \text{(Formula 3)}$$

$F_{osc}$" in Formula 3 represents an operating frequency obtained when the third capacitor element C3 and the fourth capacitor element C4 are connected to the oscillator circuit 800, C3 in Formula 3 represents a capacitance of the third capacitor element, and C4 in Formula 3 represents a capacitance of the fourth capacitor element.

It may be understood that, when the third capacitor element C3 and the fourth capacitor element C4 are connected to the oscillator circuit 800, the oscillator circuit 800 can operate at an operating frequency lower than $F_{osc}$. This can further expand an operating frequency range of the oscillator circuit 800.

Figure 14:
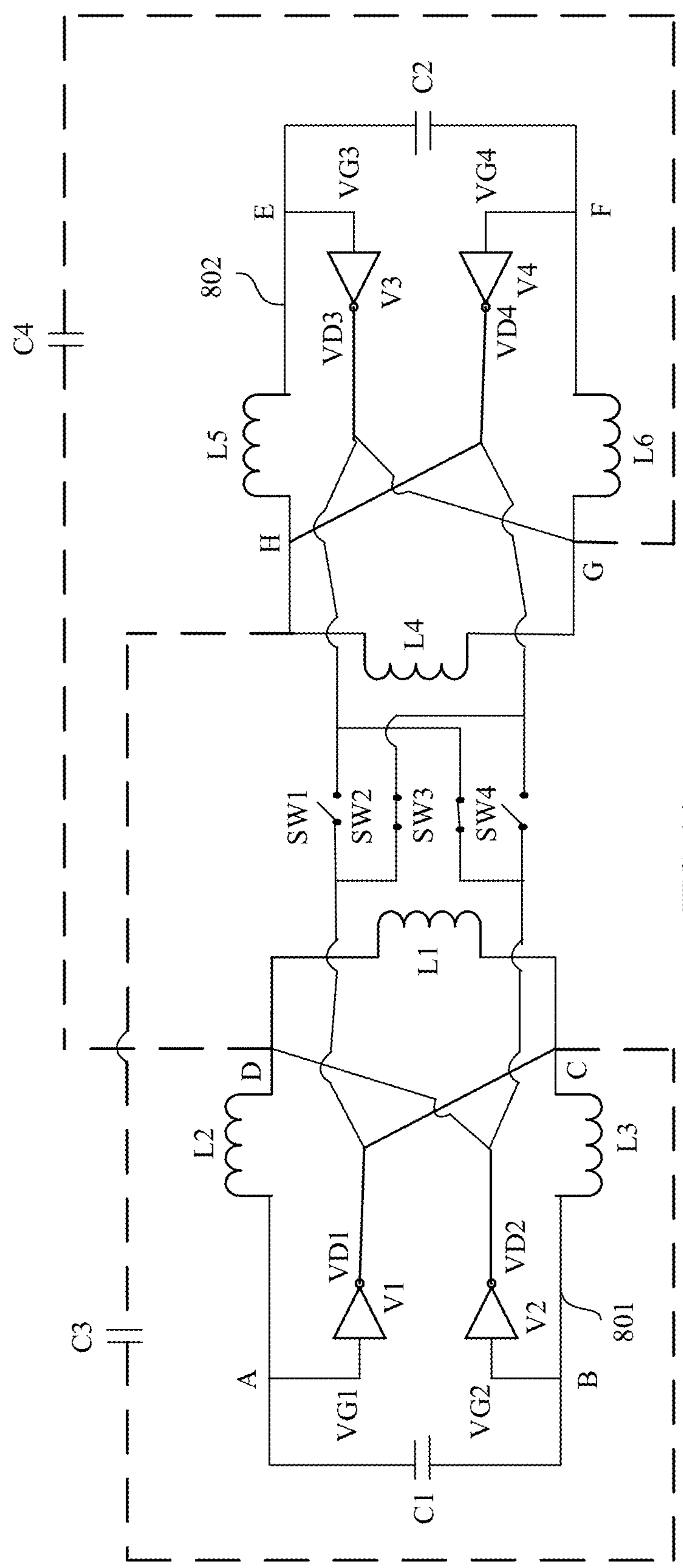
FIG. 14 is a schematic diagram of a structure of an oscillator circuit according to an embodiment of this application.

When the first switch SW1 and the fourth switch SW4 are turned off, and the second switch SW2 and the third switch SW3 are turned on, a phase of the output port VD1 of the first transconductance amplifier V1 is the same as a phase of the output port VD4 of the fourth transconductance amplifier V4, and a phase of the output port VD2 of the second transconductance amplifier V2 is the same as a phase of the output port VD3 of the third transconductance amplifier V3. For a phase of the fourth output port H coupled to the third capacitor element C3, refer to the phase of VD4 (as shown in (b) in FIG. 11), and for a phase of the first output port C coupled to the third capacitor element C3, refer to the phase of VD1 (as shown in (a) in FIG. 11). In this case, the phases of the first output port C and the fourth output port H that are coupled to the third capacitor element C3 are the same. As shown in FIG. 14, it may be considered that the third capacitor element C3 is not connected to the oscillator circuit 800. Similarly, for a phase of the second output port D coupled to the fourth capacitor element C4, refer to the phase of VD2 (as shown in (c) in FIG. 11), and for a phase of the third output port G coupled to the fourth capacitor element C4, refer to the phase of VD3 (as shown in (d) in FIG. 11). In this case, the phases of the second output port D and the third output port G that are coupled to the fourth capacitor element C4 are the same. As shown in FIG. 14, it may be considered that the fourth capacitor element C4 is not connected to the oscillator circuit 800.

When the third capacitor element C3 and the fourth capacitor element C4 are not connected to the oscillator circuit 800, reference is made to a manner in which the operating frequency of the oscillator circuit 800 is calculated according to Formula 2. An operating frequency $F_{osc}$' represented by Formula 2 is the operating frequency of the oscillator circuit 800 when the third capacitor element C3 and the fourth capacitor element C4 are not connected to the oscillator circuit 800. Therefore, for an operating frequency obtained when the third capacitor element C3 and the fourth capacitor element C4 are not connected to the oscillator circuit 800, refer to Formula 2.

Therefore, in this application, when the third capacitor element C3 and the fourth capacitor element C4 are connected to the oscillator circuit 800, the oscillator circuit 800 can operate in a wide frequency coverage area. Further, in a case in which a frequency coverage area is inversely proportional to power consumption and noise of the oscillator circuit, a larger frequency coverage area indicates less power consumption and less noise. In this way, the frequency coverage area of the oscillator circuit is expanded, and the power consumption and the noise of the oscillator circuit are reduced.

In addition, for the oscillator circuit 800 provided in this application, both the first inductor element 801 and the second inductor element 802 are multi-port inductor elements. With reference to FIG. 13, the first inductor element 801 includes a first input port A, a second input port B, a first output port C, and a second output port D. The first input port A is coupled to an input port VG1 of the first transconductance amplifier V1, the second input port B is coupled to an input port VG2 of the second transconductance amplifier V2, the first output port C is coupled to an output port VD1 of the first transconductance amplifier V1, and the second output port D is coupled to an output port VD2 of the second transconductance amplifier V2.

The second inductor element 802 includes a third input port E, a fourth input port F, a third output port G, and a fourth output port H. The third input port E is coupled to an input port VG3 of the third transconductance amplifier V3, the fourth input port F is coupled to an input port VG4 of the fourth transconductance amplifier V4, the third output port G is coupled to an output port VD3 of the third transconductance amplifier V3, and the fourth output port H is coupled to an output port VD4 of the fourth transconductance amplifier V4.

The first capacitor element C1 is coupled between the first input port A and the second input port B of the first inductor element 801, and the second capacitor element C2 is coupled between the third input port E and the fourth input port F of the second inductor element 802.

The third capacitor element C3 is coupled between the second input port B and the fourth output port H, and the fourth capacitor element C4 is coupled between the first output port C and the third input port E.

Figure 15:
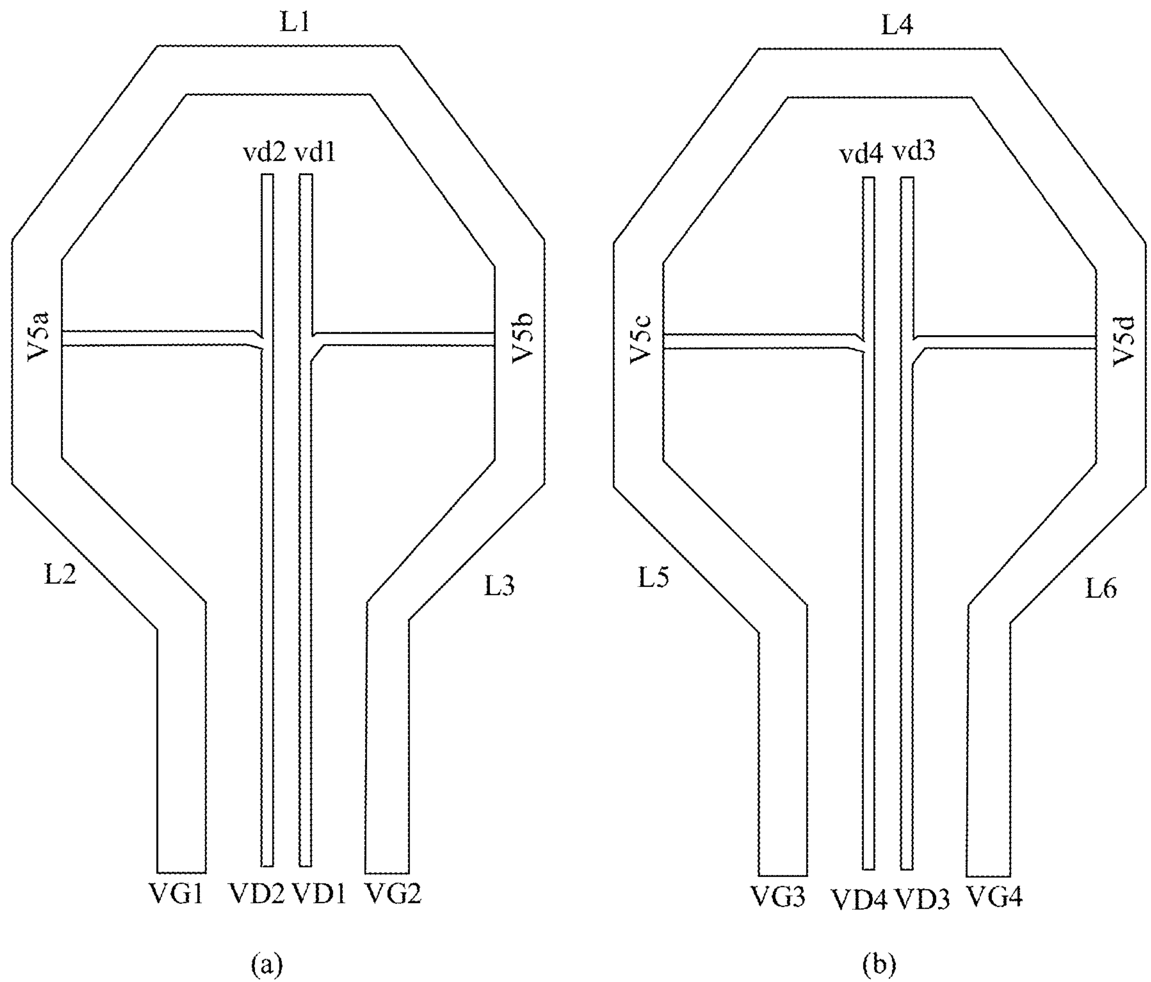
FIG. 15 is a schematic diagram of an example layout of a first inductor element and a second inductor element according to an embodiment of this application.

An example layout of the first inductor element 801 may be shown in (a) in FIG. 15, and an example layout of the second inductor element 802 may be shown in (b) in FIG. 15. Because the first inductor element 801 and the second inductor element 802 in this application are further coupled to the switch matrix, different from the inductor element 300 shown in FIG. 3, the first inductor element 801 and the second inductor element 802 further include terminals coupled to the switch matrix. The terminals through which the first inductor element 801 is coupled to the switch matrix may be a terminal vd1 to which the output port VD1 of the first transconductance amplifier V1 is extended and a terminal vd2 to which the output port VD2 of the second transconductance amplifier V2 is extended. The terminals through which the second inductor element 802 is coupled to the switch matrix may be a terminal vd3 to which the output port VD3 of the third transconductance amplifier V3 is extended and a terminal vd4 to which the output port VD4 of the fourth transconductance amplifier V4 is extended.

In a correspondence with the switch matrix shown in FIG. 9, the terminal vd1 is coupled to the first switch SW1 and the second switch SW2, the terminal vd2 is coupled to the third switch SW3 and the fourth switch SW4, the terminal vd3 is coupled to the first switch SW1 and the third switch SW3, and the terminal vd4 is coupled to the second switch SW2 and the fourth switch SW4.

It should be noted that in FIG. 15, a conductive segment VG1-V5*a* corresponds to the inductor L2 in FIG. 8, a conductive segment VG2-V5*b* corresponds to the inductor L3 in FIG. 8, V5*a*-V5*b* corresponds to the inductor L1 in FIG. 8, a conductive segment VG3-V5*c* corresponds to the inductor L5 in FIG. 8, a conductive segment VG4-V5*d* corresponds to the inductor L6 in FIG. 8, and V5*c*-V5*d* corresponds to the inductor L4 in FIG. 8.

In some embodiments, a main coil of each of the first inductor element 801 and the second inductor element 802 may include a plurality of metal layers. Because the first inductor element 801 and the second inductor element 802 are coupled to each other, with reference to FIG. 16, the first inductor element 801 and the second inductor element 802 may overlap each other, and a switch matrix is coupled at an overlapping part. When a layout area of the chip is designed, an area in which the first inductor element 801 and the second inductor element 802 overlap each other may be configured based on a design requirement. When a designed overlapping area is small, an absolute value of the coupling coefficient is small, and the operating frequency range of the oscillator circuit 800 is small. Conversely, when the designed overlapping area is large, the absolute value of the coupling coefficient is large, and the operating frequency range of the oscillator circuit 800 is large.

Figure 16:
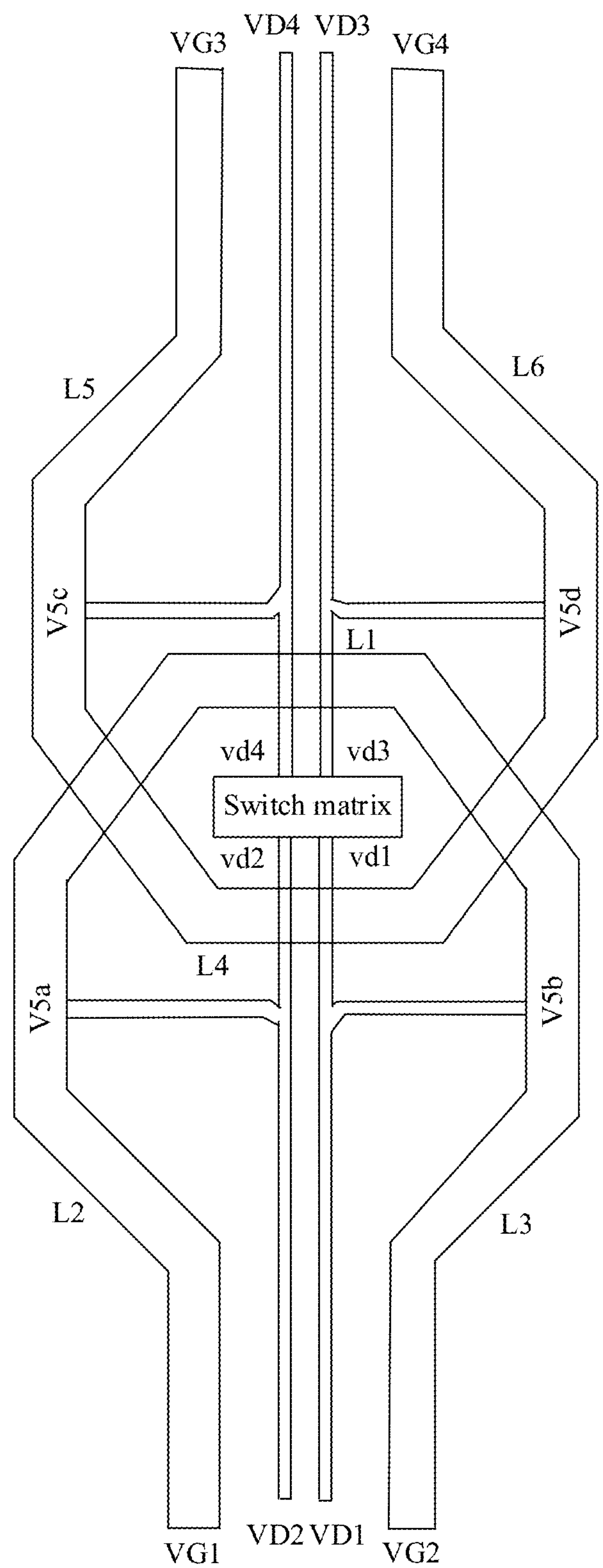
FIG. 16 is a schematic diagram of coupling between a first inductor element and a second inductor element by using a switch matrix according to an embodiment of this application.
Figure 17A:
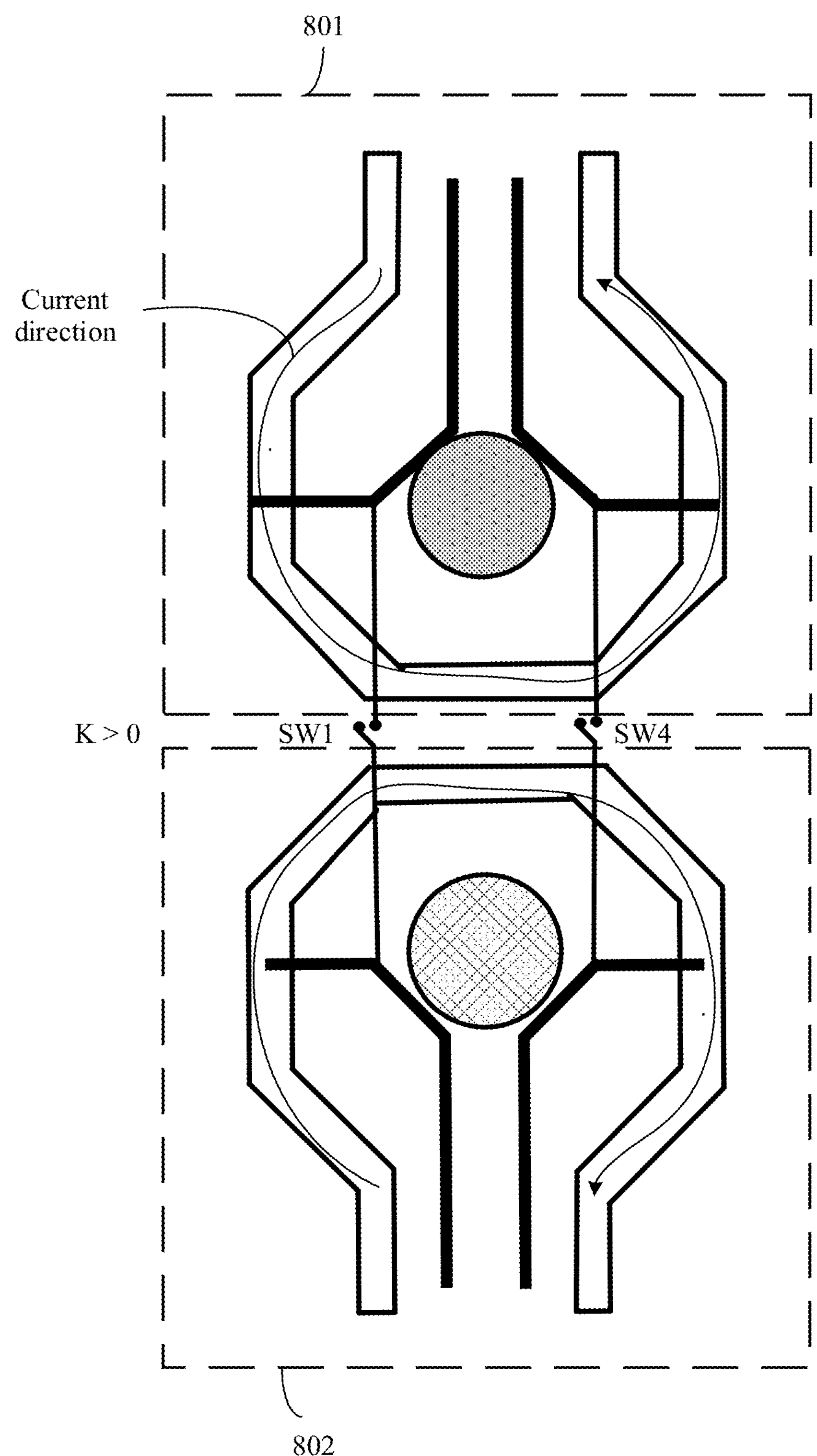
FIG. 17*a* and FIG. 17*b* are schematic diagrams of a relationship between different turned-on switch combinations and each of a current direction of an inductor and a coupling coefficient when a first inductor element and a second inductor element are coupled to each other according to an embodiment of this application.
Figure 17B:
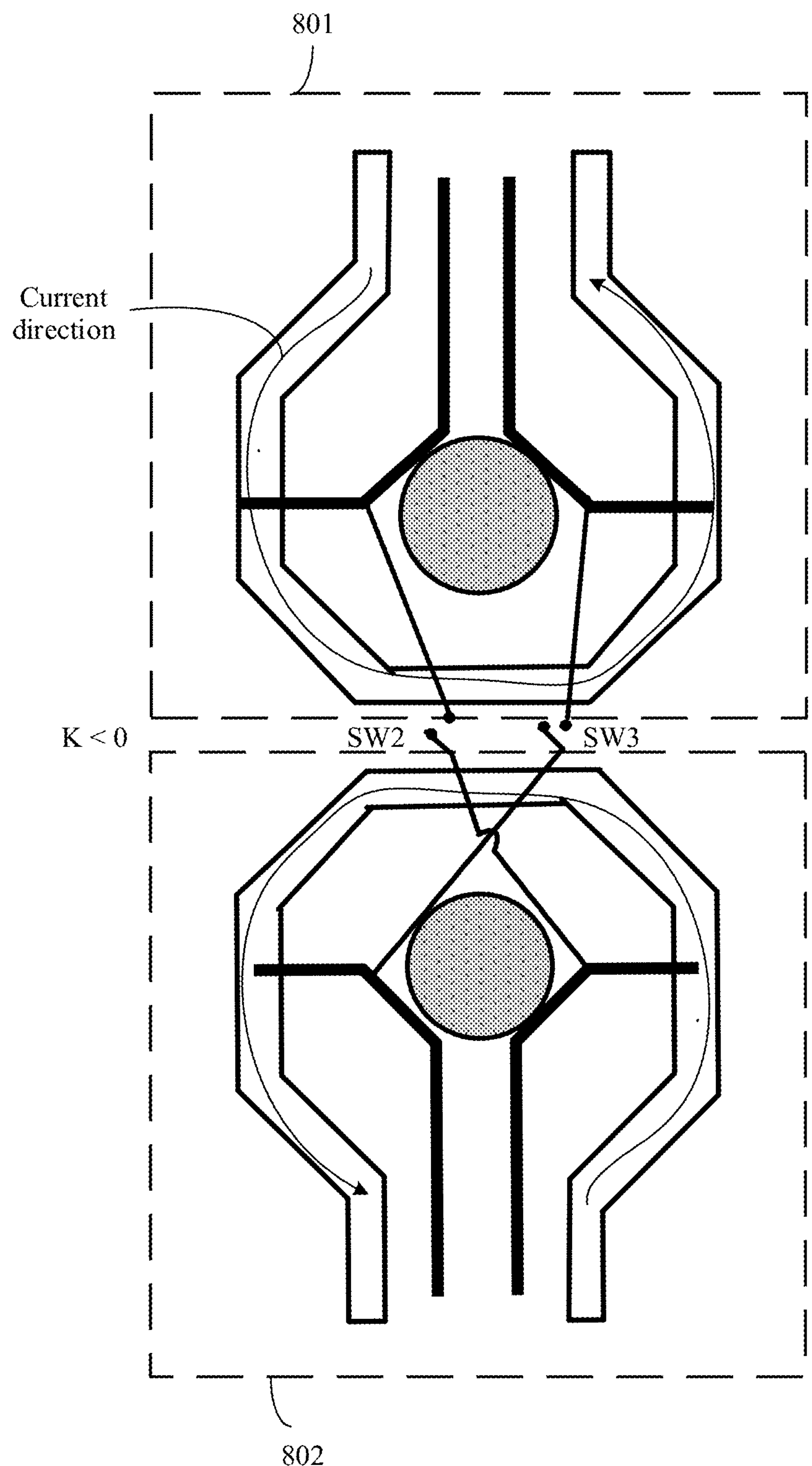

Based on FIG. 16, FIG. 17*a* and FIG. 17*b* are schematic diagrams of a relationship between different turned-on switch combinations and each of a current direction of an inductor and a coupling coefficient when the first inductor element 801 and the second inductor element 802 are coupled to each other. It can be learned that in FIG. 17*a*, when the first switch SW1 and the fourth switch SW4 are turned on (shown in FIG. 17*a*) and the second switch SW2 and the third switch SW3 are turned off (not shown in FIG. 17*a*), and when k is greater than 0, relative current directions of the first inductor element 801 and the second inductor element 802 are the same. In FIG. 17*b*, when the first switch SW1 and the fourth switch SW4 are turned off (not shown in FIG. 17*b*) and the second switch SW2 and the third switch SW3 are turned on (shown in FIG. 17*b*), and when k is less than 0, relative current directions of the first inductor element 801 and the second inductor element 802 are opposite.

Figure 18:
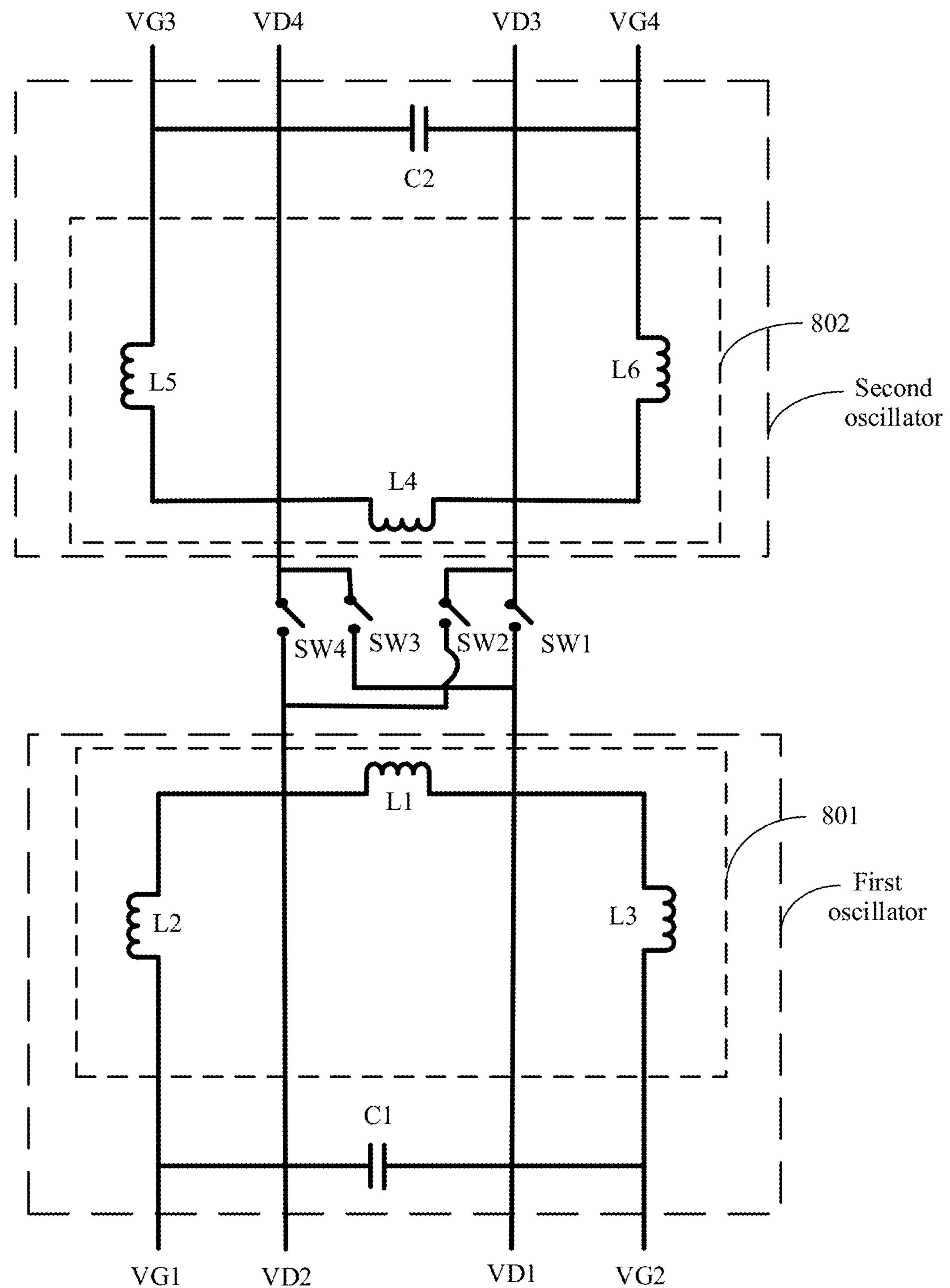
FIG. 18 is an ideal schematic diagram of an oscillator circuit according to an embodiment of this application.

Similar to FIG. 4, in the oscillator circuit 800, an ideal schematic diagram obtained when the first inductor element 801, the second inductor element 802, the first capacitor element C1, the second capacitor element C2, and the switch matrix are coupled to each other may be shown in FIG. 18.

Figure 19:
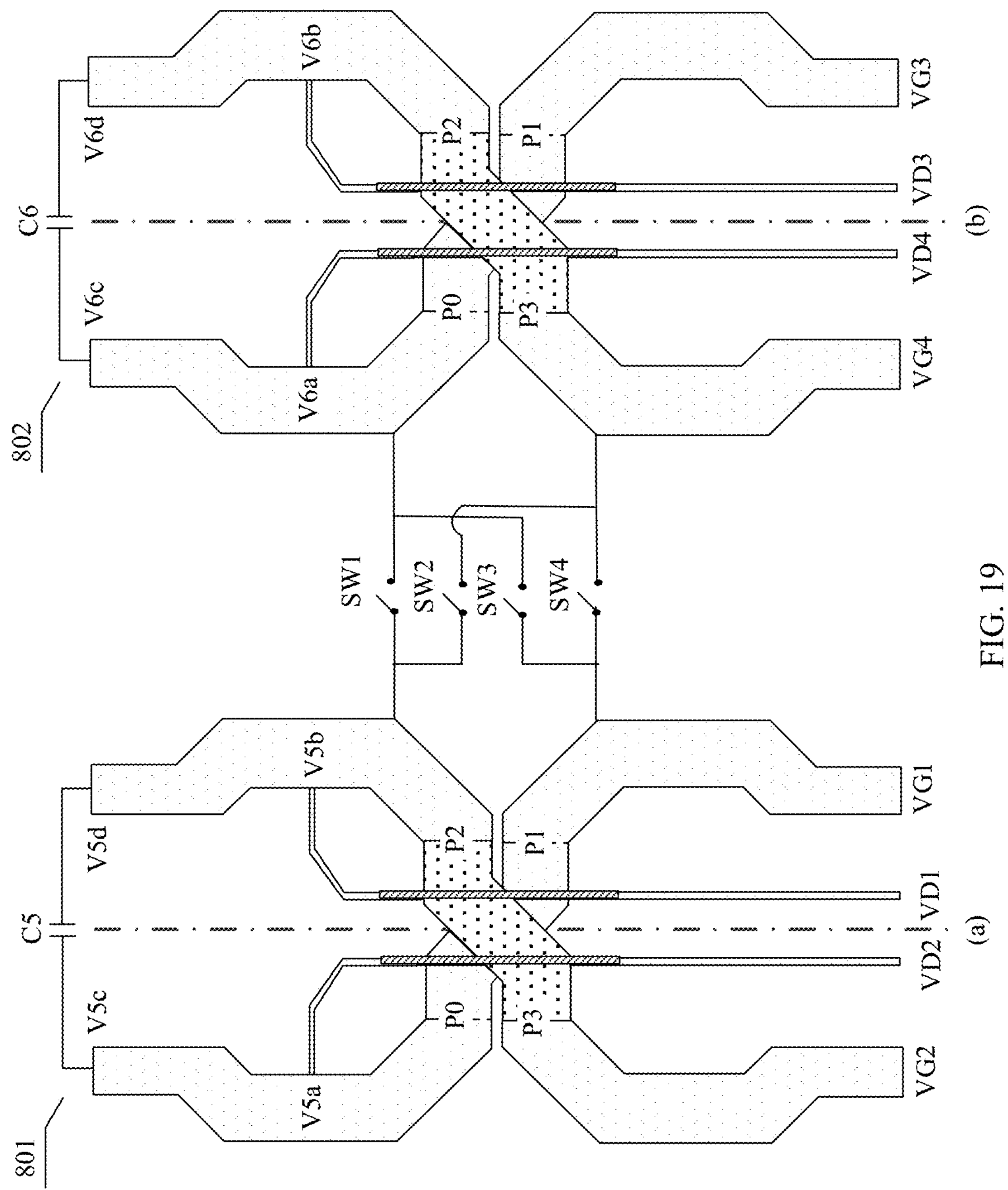
FIG. 19 is a schematic diagram of coupling when a first inductor element and a second inductor element are an 8-shaped physical loop according to an embodiment of this application.

In some embodiments, as shown in FIG. 19, when the first inductor element 801 includes a plurality of conductive segments, the plurality of conductive segments may form an 8-shaped physical loop in a manner of layer-hopping cross. Similarly, the second inductor element 802 may also be an 8-shaped physical loop.

"8-shaped" herein may be understood as: a geometric shape including two rings or approximate rings (for example, polygons) that form an 8 shape, both of the two geometric shapes are of an axisymmetric structure, and the two geometric shapes may be closed shapes or may be non-closed shapes. Each conductive segment herein may be understood as an inductor with two terminals. For example, each conductive segment may be one coil with two terminals.

As shown in (a) in FIG. 19, the first inductor element 801 may be divided into two segments of inductors: a first segment of inductor and a second segment of inductor. The two segments of inductors are coupled to each other through a fifth capacitor C5. In (a) in FIG. 19, the first segment of inductor may include VG1-V5*a*, V5*a*-V5*c*, and V5*a*-VD2, and VG1 and V5*c* may be two output ports of the first segment of inductor. The second segment of inductor may include VG2-V5*b*, V5*b*-V5*d*, and V5*b*-VD1, and VG2 and V5*d* may be two output ports of the second segment of inductor.

As shown in (b) in FIG. 19, the second inductor element 802 may also be divided into two segments of inductors: a third segment of inductor and a fourth segment of inductor. The two segments of inductors are coupled to each other through a sixth capacitor C6. In (b) in FIG. 19, the third segment of inductor may include VG3-V6*a*, V6*a*-V6*c*, and V6*a*-VD4, and VG3 and V6*c* may be two output ports of the third segment of inductor. The fourth segment of inductor may include VG4-V6*b*, V6*b*-V6*d*, and V6*b*-VD3, and VG4 and V6*d* may be two output ports of the fourth segment of inductor. A switch matrix is coupled between the first inductor element 801 and the second inductor element 802.

Figure 20:
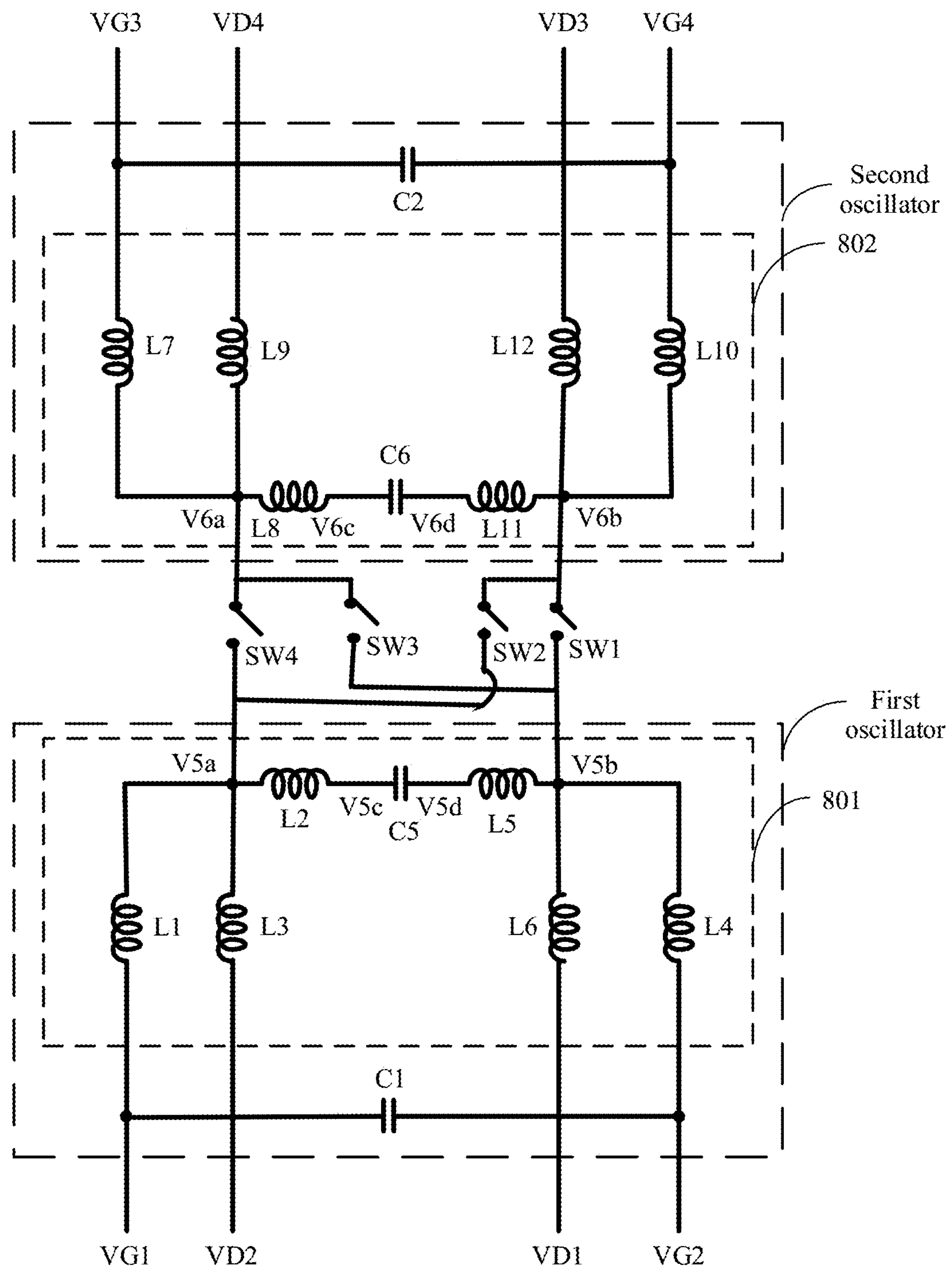
FIG. 20 is an ideal schematic diagram of an oscillator circuit according to an embodiment of this application.

FIG. 20 is an ideal schematic diagram of an oscillator circuit 800 corresponding to FIG. 19. The segment VG1-V5*a* in FIG. 19 corresponds to an inductor L1 in the schematic diagram of FIG. 20, V5*a*-V5*c* corresponds to L2 in the schematic diagram of FIG. 20, V5*a*-VD2 corresponds to an inductor L3 in the schematic diagram of FIG. 20, VG2-V5*b* corresponds to an inductor L4 in the schematic diagram of FIG. 20, V5*b*-V5*d* corresponds to L5 in the schematic diagram of FIG. 20, and V5*b*-VD1 corresponds to L6 in the schematic diagram of FIG. 20.

The segment VG3-V6*a* in FIG. 19 corresponds to an inductor L7 in the schematic diagram of FIG. 20, V6*a*-V6*c* corresponds to L8 in the schematic diagram of FIG. 20, V6*a*-VD4 corresponds to an inductor L9 in the schematic diagram of FIG. 20, VG4-V6*b* corresponds to an inductor L10 in the schematic diagram of FIG. 20, V6*b*-V6*d* corresponds to L11 in the schematic diagram of FIG. 20, and V6*b*-VD3 corresponds to an inductor L12 in the schematic diagram of FIG. 20. A switch matrix is coupled between the first inductor element 801 and the second inductor element 802.

In actual application, the plurality of conductive segments that form the 8-shaped physical loop may be cabled in a manner of layer-hopping cross. Optionally, the plurality of conductive segments may be separately cabled to a top metal layer and a sub-top metal layer, or may be separately cabled to the top metal layer and a redistribution layer (RDL). For example, the 8-shaped physical loop may be divided into a non-crossing part and two crossing parts during cabling. The non-crossing part and one of the two crossing parts may be cabled to the top metal layer, and the other crossing part may be cabled to the sub-top metal layer or the redistribution layer. FIG. 19 is used as an example. The two crossing parts may include P0-P1 and P2-P3, and the non-crossing part includes other parts in the physical loop except P0-P1 and P2-P3. Certainly, the plurality of conductive segments may be alternatively cabled to another metal layer. This is not specifically limited in this embodiment of this application.

It should be noted that, a chip of an integrated circuit (which may also be referred to as a die) generally includes a plurality of metal layers. A metal layer near a substrate of the integrated circuit may be referred to as a low metal layer, and a metal layer far away from the substrate may be referred to as a high metal layer. The top metal layer may be a metal layer that is farthest from the substrate and that is in the high metal layer, and the sub-top metal layer may be a metal layer next to the top metal layer. The foregoing redistribution layer is located between the chip of the integrated circuit and a package, and the redistribution layer may be specifically an aluminum layer.

Figure 21:
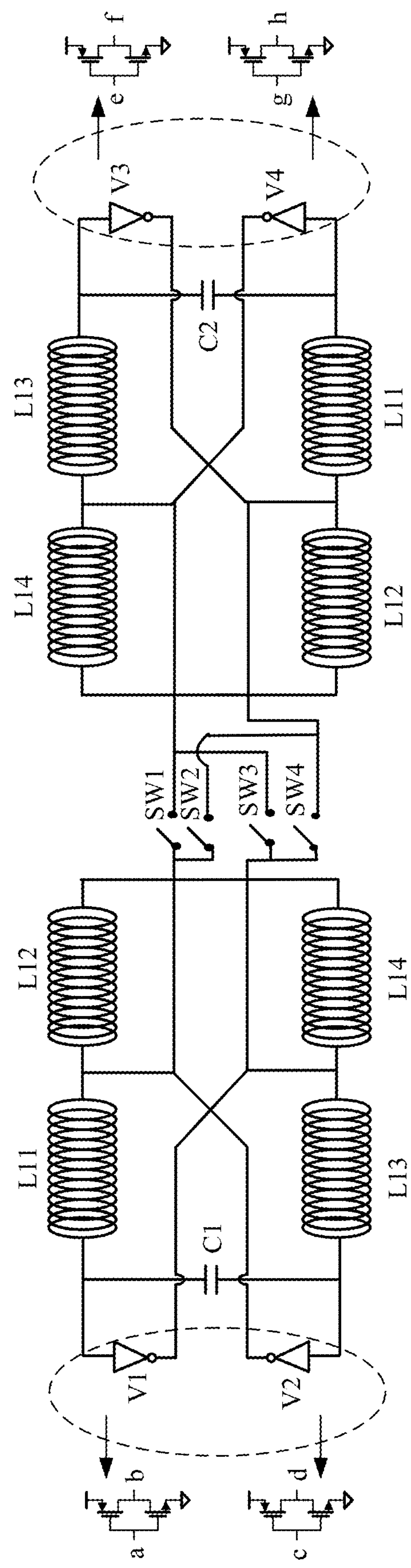
FIG. 21 is a schematic diagram of a circuit of a class AB oscillator according to an embodiment of this application.

In some embodiments, FIG. 21 is a schematic diagram of a circuit including a class AB oscillator practiced according to a principle of this application. In FIG. 21, a first transconductance amplifier V1 may include one PMOS transistor and one NMOS transistor, and a second transconductance amplifier V2 may also include one PMOS transistor and one NMOS transistor. A source of the PMOS transistor is coupled to a positive power rail (VDD), and a source of the NMOS transistor is coupled to a negative power rail (a ground cable). Gates a of the PMOS transistor and the NMOS transistor in the first transconductance amplifier V1 are coupled to a first input port A of the first inductor element 801, and drains b of the PMOS transistor and the NMOS transistor in the first transconductance amplifier V1 are coupled to a first output port C of the first inductor element 801. Gates c of the PMOS transistor and the NMOS transistor in the second transconductance amplifier V2 are coupled to a second input port B of the first inductor element 801, and drains d of the PMOS transistor and the NMOS transistor in the second transconductance amplifier V2 are coupled to a second output port D of the first inductor element 801.

The third transconductance amplifier V3 and the fourth transconductance amplifier V4 each may include one PMOS transistor and one NMOS transistor. A source of the PMOS transistor is coupled to a positive power rail (VDD), and a source of the NMOS transistor is coupled to a negative power rail (a ground cable). Gates e of the PMOS transistor and the NMOS transistor in the third transconductance amplifier V3 are coupled to a third input port E of the second inductor element 802, and drains f of the PMOS transistor and the NMOS transistor in the third transconductance amplifier V3 are coupled to a third output port G of the second inductor element 802. Gates g of the PMOS transistor and the NMOS transistor in the fourth transconductance amplifier V4 are coupled to a fourth input port F of the second inductor element 802, and drains h of the PMOS transistor and the NMOS transistor in the fourth transconductance amplifier V4 are coupled to a fourth output port H of the second inductor element 802.

A switch matrix is coupled among the drains b (an output port VD1 of V1) of the PMOS transistor and the NMOS transistor in the first transconductance amplifier V1, the drains d (an output port VD2 of V2) of the PMOS transistor and the NMOS transistor in the second transconductance amplifier V2, the drains f (an output port VD3 of V3) of the PMOS transistor and the NMOS transistor in the third transconductance amplifier V3, and the drains h (an output port VD4 of V4) of the PMOS transistor and the NMOS transistor in the fourth transconductance amplifier V4. For a coupling relationship thereof, refer to descriptions in FIG. 9.

It should be noted that, in actual application, the equivalent inductors L1-L6 in the oscillator circuit 800 shown in FIG. 18 may be designed by using the inductors L11-L18 shown in FIG. 21. L11-L18 are merely examples, and do not constitute a limitation on this embodiment of this application.

In FIG. 21, when turned-on switch combinations and turned-off switch combinations in the switch matrix are different, relative current directions of the equivalent inductors may be different, so that coupling coefficients between the inductors are different, and obtained operating frequencies of the oscillator circuit 800 are also different.

Figure 22:
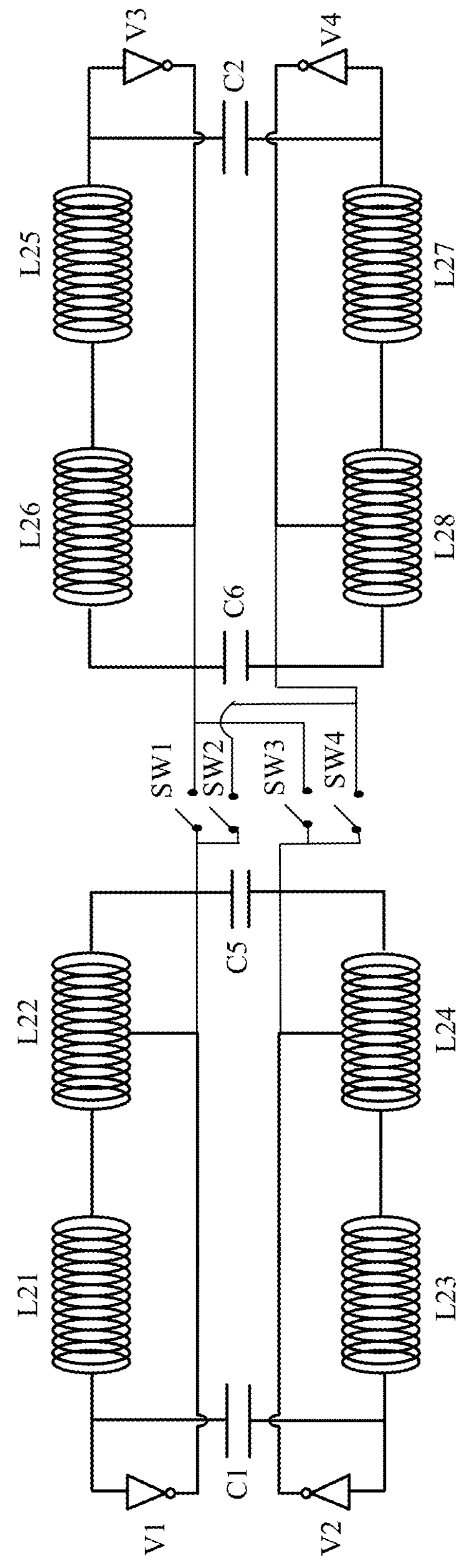
FIG. 22 is a schematic diagram of a circuit of a class AB oscillator according to an embodiment of this application.

In some embodiments, FIG. 22 is a schematic diagram of another circuit including a class AB oscillator as an example of an oscillator circuit 800 practiced according to a principle of this application. In FIG. 22, a first transconductance amplifier V1, a second transconductance amplifier V2, a third transconductance amplifier V3, and a fourth transconductance amplifier V4 are the same as those in FIG. 21. For specific descriptions, refer to related descriptions in FIG. 21. Details are not described in this embodiment of this application.

In actual application, the equivalent inductors L1-L12 in FIG. 20 may be designed by using inductors L21-L28 shown in FIG. 22. L21-L28 are merely examples, and do not constitute a limitation on this embodiment of this application.

Figure 23:
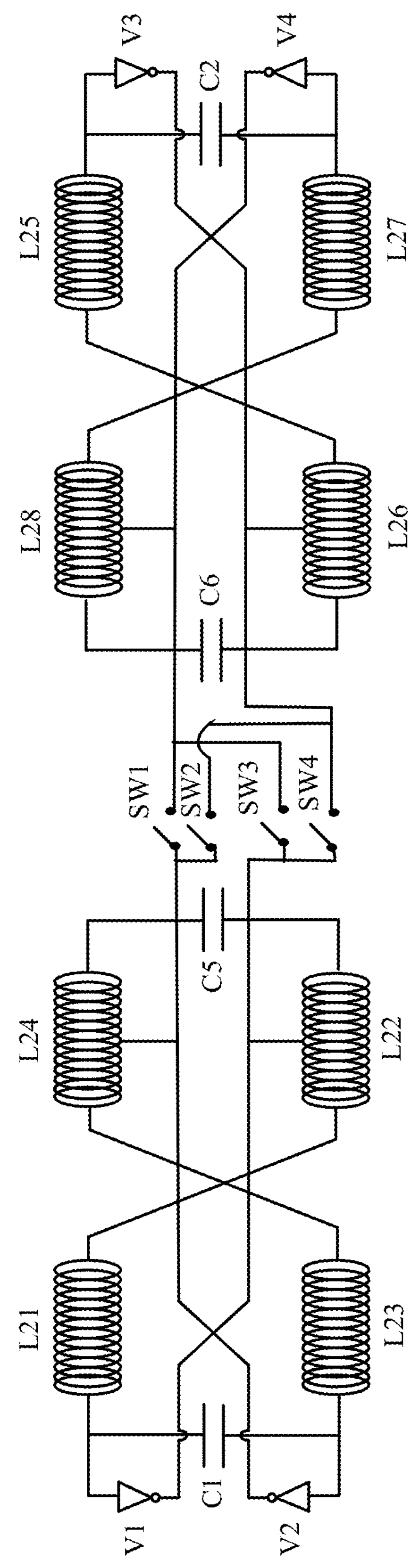
FIG. 23 is a schematic diagram of a circuit of a class AB oscillator according to an embodiment of this application.

Because an 8-shaped inductor has an anti-interference characteristic, L21-L24 in FIG. 22 are disposed as an 8-shaped physical loop, so that L21-L24 can form two magnetic fields with opposite directions, to achieve an anti-interference purpose. For example, as shown in FIG. 23, when an 8 shape is to be designed, locations of L22 and L24 in FIG. 22 may be interchanged, and then L1 and L3 are disposed as one half circle of the 8 shape, and L2 and L4 are disposed as the other half circle of the 8 shape. That is, one 8-shaped physical loop is obtained. Similarly, L25-L28 in FIG. 22 are disposed as an 8-shaped physical loop, so that L25-L28 can form two magnetic fields with opposite directions, to achieve an anti-interference purpose. For example, as shown in FIG. 23, when an 8 shape is to be designed, locations of L26 and L28 in FIG. 22 may be interchanged, and then L5 and L7 are disposed as one half circle of the 8 shape, and L6 and L8 are disposed as the other half circle of the 8 shape. That is, another 8-shaped physical loop is obtained.

Therefore, in this embodiment of this application, the two oscillators are coupled by using the switch matrix, so that the relative current directions of the inductors in the two oscillators can be changed, thereby changing the coupling coefficients between the inductors, and changing the operating frequency of the oscillator (or the oscillator circuit). In this case, only one oscillator circuit is needed in this application to cover a wider frequency range than one conventional oscillator structure, thereby helping reduce a chip area and power consumption. In addition, in the oscillator circuit in this application, mode switching of the operating frequency is independent of the oscillation loop in a manner of coupling the switch matrix. This helps maintain a high quality factor of the oscillation loop.

Figure 24:
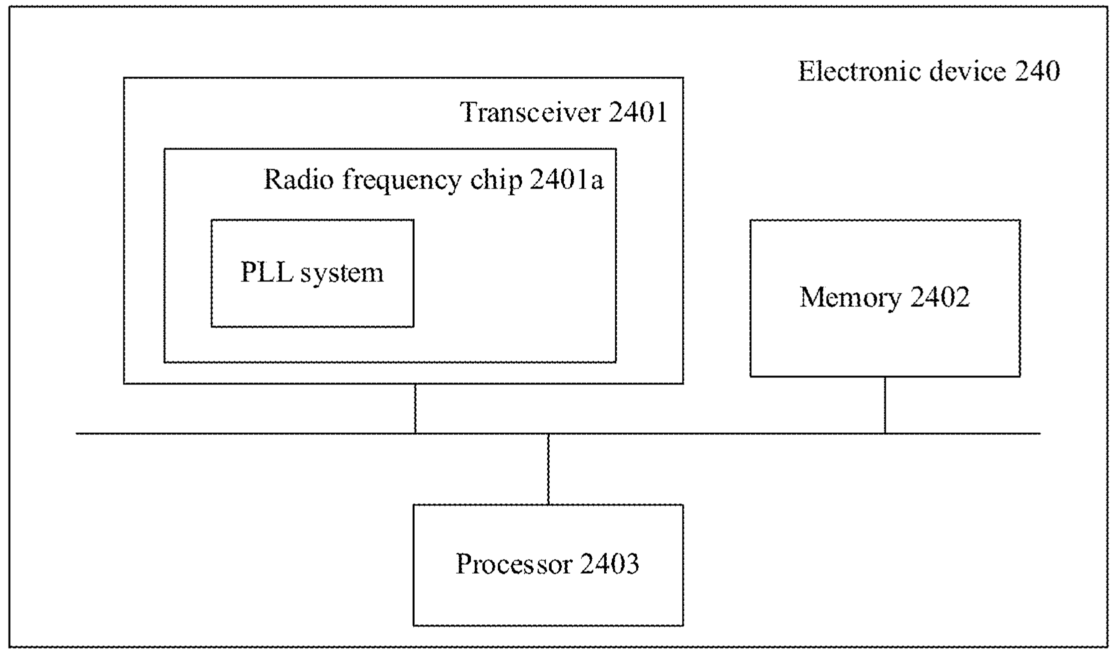
FIG. 24 is a schematic diagram of a structure of an electronic device according to an embodiment of this application.

An embodiment of this application further provides an electronic device 240. With reference to FIG. 24, the electronic device 240 may include a transceiver 2401, a memory 2402, and a processor 2403. The transceiver 2401 includes a radio frequency chip 2401*a*. The radio frequency chip 2401*a* includes a PLL system, and the PLL system may include any oscillator circuit 800 described above, for example, any oscillator circuit in FIG. 8, FIG. 9A, FIG. 10, FIG. 12, FIG. 13, FIG. 14, FIG. 18, and FIG. 20 to FIG. 23. For a structure of the PLL system, refer to the structure shown in FIG. 1. That is, for a specific structure of an oscillator in the PLL system, refer to any oscillator circuit shown in this application. In some embodiments, with reference to FIG. 8, the oscillator circuit includes a first oscillator, a second oscillator, and a switch matrix.

The first oscillator includes a first transconductance amplifier, a second transconductance amplifier, and a first resonator.

The second oscillator includes a third transconductance amplifier, a fourth transconductance amplifier, and a second resonator.

The first resonator includes a first capacitor element and a first inductor element, the second resonator includes a second capacitor element and a second inductor element, and the first inductor element is coupled to the second inductor element.

The switch matrix includes a first switch, a second switch, a third switch, and a fourth switch.

The first switch is coupled to an output port of the first transconductance amplifier and an output port of the third transconductance amplifier. The second switch is coupled to the output port of the first transconductance amplifier and an output port of the fourth transconductance amplifier. The third switch is coupled to an output port of the second transconductance amplifier and the output port of the third transconductance amplifier. The fourth switch is coupled to the output port of the second transconductance amplifier and the output port of the fourth transconductance amplifier.

The electronic device 240 shown in FIG. 24 may be a terminal device, a network device, or the like.

Figure 25:
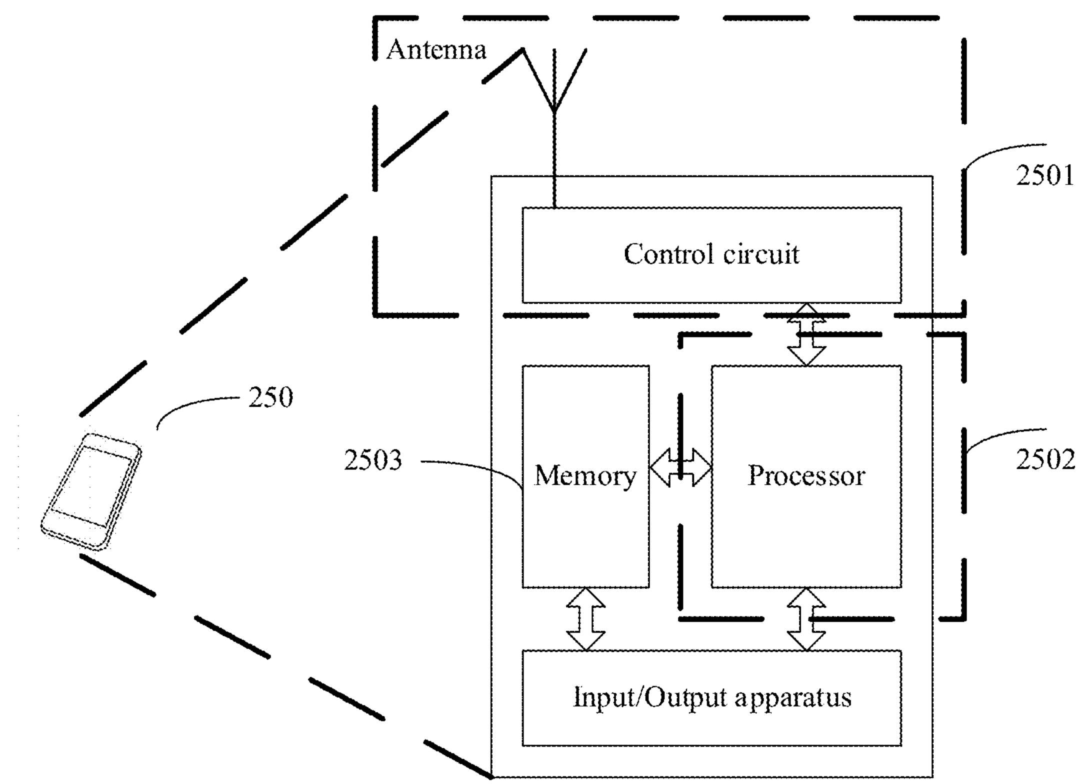
FIG. 25 is a schematic diagram of a structure of a terminal device according to an embodiment of this application.

When the electronic device 240 is the terminal device, for ease of description, FIG. 25 shows only main components of the terminal device. As shown in FIG. 25, a terminal device 250 includes a processor 2502, a memory 2503, a control circuit, an antenna, and an input/output apparatus. The processor 2502 is mainly configured to process a communication protocol and communication data, control the entire terminal device, execute a software program, and process data of the software program, for example, support the terminal device 250 in performing actions described in the foregoing method embodiments. The memory 2503 is mainly configured to store a software program and data. The control circuit is mainly configured to: convert a baseband signal and a radio frequency signal, and process the radio frequency signal. The control circuit and the antenna may also be referred to as a transceiver 2501 that is mainly configured to send and receive a radio frequency signal in an electromagnetic wave form. The control circuit may include the radio frequency chip 2401*a* provided in this application. The input/output apparatus, for example, a touchscreen, a display screen, and a keyboard, is mainly configured to receive data input by a user and output data to the user.

After the terminal device is powered on, the processor 2502 may read the software program in a memory, interpret and execute instructions of the software program, and process the data of the software program. When data needs to be wirelessly sent, after the processor 2502 performs baseband processing on to-be-sent data, the processor 2502 outputs a baseband signal to a radio frequency circuit. After the radio frequency circuit performs radio frequency processing on the baseband signal, the radio frequency circuit sends a radio frequency signal in the electromagnetic wave form through the antenna. When data is sent to the terminal device, the radio frequency circuit receives a radio frequency signal through the antenna, converts the radio frequency signal into a baseband signal, and outputs the baseband signal to the processor 2502. The processor 2502 converts the baseband signal into data, and processes the data.

A person skilled in the art may understand that, for ease of description, FIG. 25 shows only one memory and one processor. In an actual terminal device, there may be a plurality of processors and a plurality of memories. The memory may also be referred to as a storage medium, a storage device, or the like. The memory may be a storage element that is on a same radio frequency chip as the processor, that is, an on-chip storage element, or a separate storage element. This is not limited in this embodiment of this application.

The foregoing descriptions are merely specific implementations of this application, but are not intended to limit the protection scope of this application. Any variation or replacement readily figured out by a person skilled in the art within the technical scope disclosed in this application shall fall within the protection scope of this application. Therefore, the protection scope of this application shall be subject to the protection scope of the claims.

What is claimed is:

1. An oscillator circuit, comprising:

a first oscillator;

a second oscillator; and a switch matrix, wherein the first oscillator comprises a first transconductance amplifier, a second transconductance amplifier, and a first resonator, wherein the second oscillator comprises a third transconductance amplifier, a fourth transconductance amplifier, and a second resonator, wherein the first resonator comprises a first capacitor element and a first inductor element, the second resonator comprises a second capacitor element and a second inductor element, and the first inductor element is coupled to the second inductor element, wherein the switch matrix comprises a first switch, a second switch, a third switch, and a fourth switch, wherein the first switch is coupled to a first output port of the first transconductance amplifier and a third output port of the third transconductance amplifier, the second switch is coupled to the first output port of the first transconductance amplifier and a fourth output port of the fourth transconductance amplifier, the third switch is coupled to a second output port of the second transconductance amplifier and the third output port of the third transconductance amplifier, and the fourth switch is coupled to the second output port of the second transconductance amplifier and the fourth output port of the fourth transconductance amplifier, and wherein the switch matrix is configured to change a coupling coefficient between the first inductor element and the second inductor element.

2. The oscillator circuit according to claim 1, wherein the switch matrix changes the coupling coefficient by controlling relative current directions of the first inductor element and the second inductor element, and wherein the switch matrix is configured to:

when the relative current directions of the first inductor element and the second inductor element are the same, control the coupling coefficient between the first inductor element and the second inductor element to be greater than zero, and when the relative current directions of the first inductor element and the second inductor element are opposite, control the coupling coefficient between the first inductor element and the second inductor element to be less than zero.

3. The oscillator circuit according to claim 1, wherein first control signals of the first switch and the fourth switch are the same, and wherein second control signals of the second switch and the third switch are the same.

4. The oscillator circuit according to claim 1, wherein, when the first switch and the fourth switch are turned on, the second switch and the third switch are turned off, and wherein, when the first switch and the fourth switch are turned off, the second switch and the third switch are turned on.

5. The oscillator circuit according to claim 4, wherein, when the first switch and the fourth switch are turned on and the second switch and the third switch are turned off, a first phase of the first output port of the first transconductance amplifier is the same as a third phase of the third output port of the third transconductance amplifier, a second phase of the second output port of the second transconductance amplifier is the same as a fourth phase of the fourth output port of the fourth transconductance amplifier, and relative current directions of the first inductor element and the second inductor element are the same, and wherein, when the first switch and the fourth switch are turned off and the second switch and the third switch are turned on, the first phase of the first output port of the first transconductance amplifier is the same as the fourth phase of the fourth output port of the fourth transconductance amplifier, the second phase of the second output port of the second transconductance amplifier is the same as the third phase of the third output port of the third transconductance amplifier, and the relative current directions of the first inductor element and the second inductor element are opposite.

6. The oscillator circuit according to claim 1, wherein both the first oscillator and the second oscillator are of differential signal structures, wherein the first oscillator comprises a first differential input port and a first differential output port, the first differential input port comprises a first input port and a second input port, the first differential output port comprises a fifth output port and a sixth output port, the first input port is coupled to a fifth input port of the first transconductance amplifier, the second input port is coupled to a sixth input port of the second transconductance amplifier, the fifth output port is coupled to the first output port of the first transconductance amplifier, and the sixth output port is coupled to the second output port of the second transconductance amplifier; and wherein the second oscillator comprises a second differential input port and a second differential output port, the second differential input port comprises a third input port and a fourth input port, the second differential output port comprises a seventh output port and an eighth output port, the third input port is coupled to a seventh input port of the third transconductance amplifier, the fourth input port is coupled to an eighth input port of the fourth transconductance amplifier, the seventh output port is coupled to the third output port of the third transconductance amplifier, and the eighth output port is coupled to the fourth output port of the fourth transconductance amplifier.

7. The oscillator circuit according to claim 6, wherein the first inductor element comprises the first input port, the second input port, the fifth output port, and the sixth output port, and wherein the second inductor element comprises the third input port, the fourth input port, the seventh output port, and the eighth output port.

8. The oscillator circuit according to claim 7, wherein the first capacitor element is coupled between the first input port and the second input port, and wherein the second capacitor element is coupled between the third input port and the fourth input port.

9. The oscillator circuit according to claim 8, wherein the oscillator circuit further comprises a third capacitor element and a fourth capacitor element, wherein the third capacitor element is coupled between the fifth output port and the eighth output port, and wherein the fourth capacitor element is coupled between the sixth output port and the seventh output port.

10. The oscillator circuit according to claim 1, wherein a corresponding main coil of each of the first inductor element and the second inductor element comprises a plurality of metal layers.

11. The oscillator circuit according to claim 1, wherein the first inductor element and the second inductor element overlap with each other.

12. The oscillator circuit according to claim 1, wherein the first inductor element comprises a plurality of conductive segments, and wherein the plurality of conductive segments form an 8-shaped physical loop.

13. An electronic device, comprising:

at least one processor; and a transceiver, wherein the at least one processor is coupled to the transceiver, and the transceiver comprises an oscillator circuit, wherein the oscillator circuit comprises a first oscillator, a second oscillator, and a switch matrix, wherein the first oscillator comprises a first transconductance amplifier, a second transconductance amplifier, and a first resonator, wherein the second oscillator comprises a third transconductance amplifier, a fourth transconductance amplifier, and a second resonator, wherein the first resonator comprises a first capacitor element and a first inductor element, the second resonator comprises a second capacitor element and a second inductor element, and the first inductor element is coupled to the second inductor element, wherein the switch matrix comprises a first switch, a second switch, a third switch, and a fourth switch, wherein the first switch is coupled to a first output port of the first transconductance amplifier and a third output port of the third transconductance amplifier, the second switch is coupled to the first output port of the first transconductance amplifier and a fourth output port of the fourth transconductance amplifier, the third switch is coupled to a second output port of the second transconductance amplifier and the third output port of the third transconductance amplifier, and the fourth switch is coupled to the second output port of the second transconductance amplifier and the fourth output port of the fourth transconductance amplifier, and wherein the switch matrix is configured to change a coupling coefficient between the first inductor element and the second inductor element.

14. The electronic device according to claim 13, further comprising a memory, wherein the at least one processor and the memory are coupled to the transceiver.

15. The electronic device according to claim 13, wherein the switch matrix changes the coupling coefficient by controlling relative current directions of the first inductor element and the second inductor element, and wherein the switch matrix is configured to:

when the relative current directions of the first inductor element and the second inductor element are the same, control the coupling coefficient between the first inductor element and the second inductor element to be greater than zero, and when the relative current directions of the first inductor element and the second inductor element are opposite, control the coupling coefficient between the first inductor element and the second inductor element to be less than zero.

16. The electronic device according to claim 13, wherein first control signals of the first switch and the fourth switch are the same, and wherein second control signals of the second switch and the third switch are the same.

17. The electronic device according to claim 13, wherein, when the first switch and the fourth switch are turned on, the second switch and the third switch are turned off, and wherein, when the first switch and the fourth switch are turned off, the second switch and the third switch are turned on.

18. The electronic device according to claim 17, wherein, when the first switch and the fourth switch are turned on and the second switch and the third switch are turned off, a first phase of the first output port of the first transconductance amplifier is the same as a third phase of the third output port of the third transconductance amplifier, a second phase of the second output port of the second transconductance amplifier is the same as a fourth phase of the fourth output port of the fourth transconductance amplifier, and relative current directions of the first inductor element and the second inductor element are the same, and wherein, when the first switch and the fourth switch are turned off and the second switch and the third switch are turned on, the first phase of the first output port of the first transconductance amplifier is the same as the fourth phase of the fourth output port of the fourth transconductance amplifier, the second phase of the second output port of the second transconductance amplifier is the same as the third phase of the third output port of the third transconductance amplifier, and the relative current directions of the first inductor element and the second inductor element are opposite.

19. The electronic device according to claim 13, wherein both the first oscillator and the second oscillator are of differential signal structures, wherein the first oscillator comprises a first differential input port and a first differential output port, the first differential input port comprises a first input port and a second input port, the first differential output port comprises a fifth output port and a sixth output port, the first input port is coupled to a fifth input port of the first transconductance amplifier, the second input port is coupled to sixth input port of the second transconductance amplifier, the fifth output port is coupled to the first output port of the first transconductance amplifier, and the sixth output port is coupled to the second output port of the second transconductance amplifier, and wherein the second oscillator comprises a second differential input port and a second differential output port, the second differential input port comprises a third input port and a fourth input port, the second differential output port comprises a seventh output port and an eighth output port, the third input port is coupled to a seventh input port of the third transconductance amplifier, the fourth input port is coupled to an eighth port of the fourth transconductance amplifier, the seventh output port is coupled to the third output port of the third transconductance amplifier, and the eighth output port is coupled to the fourth output port of the fourth transconductance amplifier.

20. The electronic device according to claim 13, wherein the first inductor element comprises a plurality of conductive segments, and wherein the plurality of conductive segments form an 8-shaped physical loop.

* * * * *